(12) United States Patent
Kamijima

(10) Patent No.: US 7,679,817 B2
(45) Date of Patent: Mar. 16, 2010

(54) LASER LIGHT SOURCE DEVICE, ILLUMINATION DEVICE, IMAGE DISPLAY DEVICE, AND MONITOR

(75) Inventor: Shunji Kamijima, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 12/007,449

(22) Filed: Jan. 10, 2008

(65) Prior Publication Data

US 2008/0259436 A1   Oct. 23, 2008

(30) Foreign Application Priority Data

Jan. 15, 2007 (JP) .............................. 2007-005905
Oct. 25, 2007 (JP) .............................. 2007-277756

(51) Int. Cl.
G02F 1/35 (2006.01)
H01S 3/10 (2006.01)

(52) U.S. Cl. ................. 359/326; 359/328; 372/22; 372/107

(58) Field of Classification Search ......... 359/326–332; 372/21–22, 99, 107, 108
See application file for complete search history.

(56) References Cited

U.S. PATENT DOCUMENTS

| 5,436,920 | A | 7/1995 | Minemoto et al. |
| 5,500,869 | A | 3/1996 | Yoshida et al. |
| 5,943,351 | A * | 8/1999 | Zhou et al. ............ 372/22 |
| 7,339,719 | B1 * | 3/2008 | Haskett et al. .......... 359/326 |
| 7,394,841 | B1 * | 7/2008 | Konttinen et al. ...... 372/45.013 |
| 7,411,992 | B2 | 8/2008 | Furukawa et al. |
| 2002/0012377 | A1 | 1/2002 | Suganuma et al. |
| 2006/0023173 | A1 | 2/2006 | Mooradian et al. |
| 2006/0023757 | A1 | 2/2006 | Mooradian et al. |
| 2006/0268241 | A1 | 11/2006 | Watson et al. |
| 2006/0280219 | A1 | 12/2006 | Shchegrov |
| 2007/0047052 | A1 | 3/2007 | Nakano et al. |
| 2007/0153862 | A1 | 7/2007 | Shchegrov et al. |
| 2007/0153866 | A1 | 7/2007 | Shchegrov et al. |
| 2007/0230532 | A1 * | 10/2007 | Copner et al. ............. 372/92 |

FOREIGN PATENT DOCUMENTS

| EP | 1 640 782 A1 | 3/2006 |
| JP | A-6-334262 | 12/1994 |
| JP | A-7-99360 | 4/1995 |
| JP | A-7-202309 | 8/1995 |
| JP | A-2001-257416 | 9/2001 |
| JP | A 2001-284719 | 10/2001 |
| JP | A-2001-358400 | 12/2001 |

(Continued)

OTHER PUBLICATIONS

Mooradian A. et al., "High Power Extended Vertical Cavity Surface Emitting Diode Lasers and Arrays and their Applications," Nov. 2, 2005, Micro-Optics Conference, Tokyo.

*Primary Examiner*—Hemang Sanghavi
(74) *Attorney, Agent, or Firm*—Oliff & Berridge, PLC

(57) ABSTRACT

A laser light source device includes: a light source; an external resonator constituting a resonator structure with the light source; a wavelength conversion element disposed between the light source and the external resonator, and converting the wavelength of the light emitted from the light source; and a first spacing member maintaining a state in which at least the wavelength conversion element is separated from the external resonator by a predetermined distance.

14 Claims, 18 Drawing Sheets

FOREIGN PATENT DOCUMENTS

| | | |
|---|---|---|
| JP | A-2002-343950 | 11/2002 |
| JP | A-2003-172856 | 6/2003 |
| JP | A-2005-182945 | 7/2005 |
| JP | A-2005-327823 | 11/2005 |
| JP | A-2006-91653 | 4/2006 |
| JP | A-2007-5352 | 1/2007 |
| JP | A 2007-65496 | 3/2007 |
| WO | WO 2006/012819 A1 | 2/2006 |

* cited by examiner

FIG. 1A
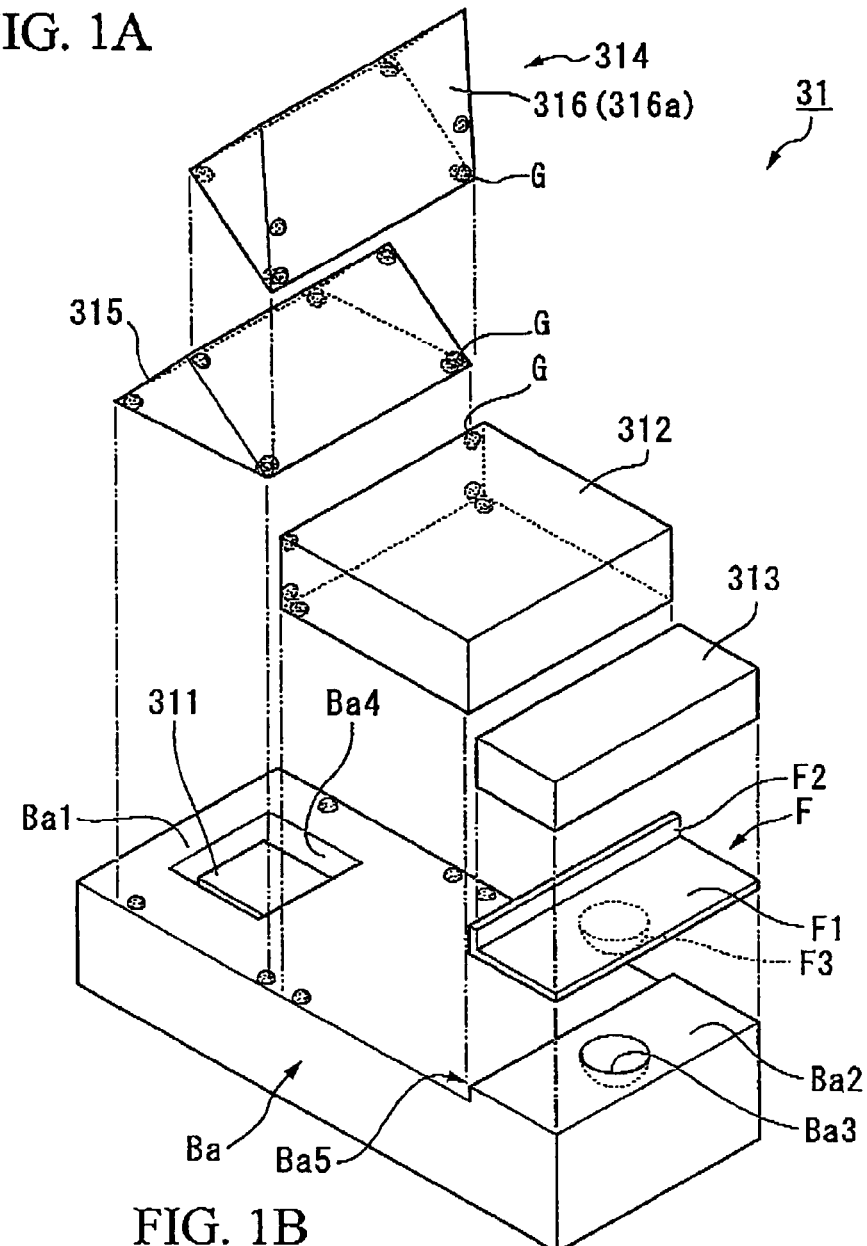
FIG. 1B
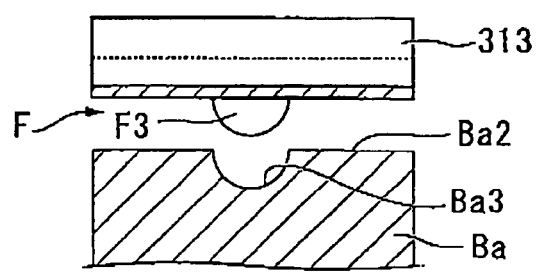
FIG. 1C

LASER LIGHT SOURCE DEVICE, ILLUMINATION DEVICE, IMAGE DISPLAY DEVICE, AND MONITOR

CROSS-REFERENCE TO RELATED APPLICATION

This application is based on and claims priority from Japanese Patent Application No. 2007-005905, filed on Jan. 15, 2007, and Japanese Patent Application No. 2007-277756, filed on Oct. 25, 2007, the contents of which are incorporated herein by reference.

BACKGROUND

1. Technical Field

The present invention relates to a laser light source device, an illumination device, an image display device, and a monitor.

2. Related Art

In recent years, in the field of opto-electronics including fiber-optic communication, light application measurement, light display, and the like, laser light source devices have been widely used.

As examples of laser light source devices, laser light source devices in which the wavelength of the fundamental wave laser is used directly without conversion, and laser light source devices in which a converted wavelength of the fundamental wave laser is used, are both well-known.

In the laser light source device in which the converted wavelength of the fundamental wave laser is used, a wavelength conversion element that converts the wavelength of the fundamental wave laser is well-known.

The wavelength conversion element is also called the Second Harmonic Generation element (SHG element).

In the laser light source device, the light emitted from the laser light source is resonated by using the laser light source device while combining an external resonator, the bandwidth of wavelength of the emitted light becomes narrow, thereby it is possible to obtain a high output of laser oscillation.

A laser light source device in which the external resonator structure is combined therein has been suggested, for example, in Japanese Unexamined Patent Application, First Publication No. 2001-284719.

In recent laser light source devices, improvement of illumination efficiency and additional miniaturization have been required.

However, in the laser light source device disclosed in the above-described Japanese Unexamined Patent Application, First Publication No. 2001-284719, not only the external resonator, but also complicated optical members such as a condenser lens, a concave lens and the like are necessary. Therefore, the constitution of the device becomes complex, and miniaturization of the device has not been realized.

Furthermore, in the case of attempting miniaturization of the device, deformations occur in the optical members, optical films disposed in an optical-path are broken, and the optical members are damaged, due to contact made with each optical member. Therefore, there is a problem in that the light utilization efficiency decreases due to the above-described deformation, breakage, and damage.

In order to solve the problem, it is possible that a surface of an optical member be connected with a surface of another optical member via an adhesive. However, the adhesive's quality can change due to the heat generated in the optical-paths. Therefore, there is a new problem in that it is difficult to efficiently utilize the light.

SUMMARY

An advantage of some aspects of the invention is to provide a laser light source device, an illumination device, an image display device, and a monitor, where the light utilization efficiency is improved, and it is possible to realize miniaturization of the device.

A first aspect of the invention provides a laser light source device including: a light source; an external resonator constituting a resonator structure with the light source; a wavelength conversion element disposed between the light source and the external resonator, and converting the wavelength of the light emitted from the light source; and a first spacing member maintaining a state in which at least the wavelength conversion element is separated from the external resonator by a predetermined distance.

According to the laser light source device of the first aspect of the invention, by the first spacing member, it is possible to maintain a state where the wavelength conversion element is separated from the external resonator by the predetermined distance.

Thus, it is possible to prevent degradation of the optical characteristics caused by the abrasion due to the surface of the wavelength conversion element 312 and the surface of the external resonator from coming in contact with each other.

In conventional constitutions, the wavelength conversion element is connected with the external resonator via an adhesive, thereby causing malfunctioning, such as malfunctioning of the laser oscillation caused by a changing and melting of the adhesive's quality due to the heat emission of the laser light, or the like to occur.

In contrast, in the laser light source device of the first aspect of the invention, it is possible to prevent the above-described malfunctioning from occurring.

Furthermore, since the wavelength conversion element is disposed so as to be close to the external resonator as possible, miniaturization of the entire device size can be realized, and it is possible to enlarge the size of the wavelength conversion element disposed between the light source and the external resonator.

Furthermore, by extending the length of the optical-path of the wavelength conversion element, it is possible to improve the wavelength conversion efficiency.

Therefore, it is possible to realize miniaturization of the constitution of the laser light source device, and to improve light utilization efficiency.

It is preferable that the laser light source device of the first aspect of the invention further include: an optical-path conversion element disposed between the light source and the wavelength conversion element and causing the light whose wavelength has been converted while returning to the light source due to reflection by the external resonator to be separated into a first optical-path and into a second optical-path different from the first optical-path, the first optical-path being formed between the light source and the external resonator, and a second spacing member maintaining a state where at least two optical members are adjacent to and separated from each other by a predetermined distance, the two optical members being selected from a group consisting of the optical-path conversion element, the light source, and the wavelength conversion element.

In this constitution, even if the optical-path conversion element is disposed between the light source and the wavelength conversion element, the second spacing member maintains a state where the optical members are adjacent to and separated from each other by a predetermined distance.

It is thereby possible to realize miniaturization of the constitution of the laser light source device, and to extend the length of the optical-path of the wavelength conversion element. Furthermore, it is possible to improve light utilization efficiency.

By disposing the external resonator at a predetermined focus of the light source, it is possible to obtain a laser beam with a higher efficiency.

Therefore, the wavelength conversion element is disposed between the light source and the external resonator disposed at the predetermined focus position.

That the wavelength conversion efficiency of the wavelength conversion element exponentially increases depending on the amount of energy density of the light beam passing through a unit area is well-known. One of the effects is that the focus is close to the external resonator, that is, the energy density increase. In other words, it is possible to dispose the wavelength conversion element so that it is close to the external resonator and does not come in contact with the external resonator. Thus, it is possible to convert the wavelength very efficiently.

It is preferable that, in the laser light source device of the first aspect of the invention, the optical-path conversion element include: a prism member leading the light emitted from the light source toward the wavelength conversion element; and an optical-path separating member leading the light from the wavelength conversion element to be separated. In this constitution, the second spacing member is disposed between the prism member and the optical-path separating member.

In this constitution, the prism member is separated from the optical-path separating member by the predetermined distance by a second spacing member. Thus, it is possible to obtain high optical-path conversion characteristics.

It is preferable that, in the laser light source device of the first aspect of the invention, the optical-path conversion element include a wavelength selective element selecting the wavelength of light from the wavelength conversion element.

In this constitution, by selecting the wavelength of light from the wavelength conversion element, it is possible to prevent the return of an unnecessary wavelength light to the light source.

It is preferable that, in the laser light source device of the first aspect of the invention, at least one of the group consisting of the first spacing member and the second spacing member holds a first optical member separated from a second optical member by a predetermined distance where the first optical member is set at a predetermined angle to the second optical member.

In this constitution, at least one of the group consisting of the first spacing member and the second spacing member can maintain a state where the first optical member is adjacent to a second optical member and the first optical member is set at a predetermined angle to the second optical member. Therefore, it is possible to realize miniaturization of the laser light source device with a high level of efficiency.

It is preferable that, in the laser light source device of the first aspect of the invention, the first spacing member and the second spacing member not be disposed in an optical-path.

In this constitution, there is no case in which the first spacing member and the second spacing member intersect the optical-path, and it is possible to extract a further amount of light from the light source to the exterior of the laser light source device. It is possible to further improve the light utilization efficiency.

It is preferable that, in the laser light source device of the first aspect of the invention, the second spacing member include a unit holding member integrating at least one of the optical members into a unit member.

In this constitution, since the optical members are integrated into a unit member, it is possible to improve the ease of assembling the laser light source device. As a result, it is possible to reduce the cost of manufacturing the laser light source device.

It is preferable that, in the laser light source device of the first aspect of the invention, at least one of the group consisting of the first spacing member and the second spacing member be integrated into a base member holding the light source.

In this constitution, since at least one of the group consisting of the first spacing member and the second spacing member is integrated into the base member, it is possible to miniaturize the entire laser light source device.

Alternatively, it is preferable that the laser light source device of the first aspect of the invention further include a thermal diffusion plate radiating the heat generated from the wavelength conversion element toward an exterior. In this constitution, at least one of the group consisting of the first spacing member and the second spacing member is integrated into the thermal diffusion plate.

In this constitution, since at least one of the group consisting of the first spacing member and the second spacing member is integrated into the thermal diffusion plate, it is possible to miniaturize the entire laser light source device.

It is preferable that, in the laser light source device of the first aspect of the invention, the first spacing member and the second spacing member be constituted from an adhesive including gap members maintaining the predetermined distance.

In this constitution, the optical members can be separated from each other by the predetermined distance by the gap member. The optical members can also be reliably connected via the adhesive.

It is preferable that, in the laser light source device of the first aspect of the invention, the light source include a plurality of arrayed emission sections.

Even if using the light source including the arrayed emission sections, the area of the emission surface (the incident surface) of the optical-path separating member, the wavelength conversion element, and the external resonator, can be suitably extended depending on the area of the arrayed emission sections, as needed.

Therefore, in this constitution, even if the light source includes the arrayed emission sections, the laser light source device does not bring an extreme increase in large size, and it is possible to realize a simple constitution and a reduction in the cost of the laser light source device.

A second aspect of the invention provides an illumination device including the laser light source device described above and a diffusion optical member disposed in the emission direction of the laser light emitted from the laser light source device.

According to the illumination device of the second aspect of the invention, since the illumination device includes the above-described laser light source device in which the miniaturization of the device has been realized and light utilization efficiency has been improved, it is possible to realize an illumination device that illuminates an object with the light having uniform illumination distribution. It is also possible to realize miniaturization of the illumination device while maintaining a high of performance.

A third aspect of the invention provides an image display device including a light source section constituted by the laser light source device described above and a light modulation element modulating the light emitted from the light source section depending on an image data.

According to the image display device of the third aspect of the invention, since the image display device includes the above-described laser light source device as the laser light source section, light utilization efficiency can be improved.

A fourth aspect of the invention provides a monitor including the laser light source device described above and an image capturing section capturing an object which is illuminated by the laser light source device.

According to the monitor of the fourth aspect of the invention, since the monitor includes the above-described laser light source device, light utilization efficiency can be improved.

BRIEF DESCRIPTION OF THE DRAWINGS

FIG. 1A is an exploded perspective view showing a laser light source device of a first embodiment. FIG. 1B is an enlarged cross-sectional view showing a resonator holding frame, an external resonator, and a base member of the laser light source device of a first embodiment. FIG. 1C is an enlarged cross-sectional view showing the resonator holding frame of the laser light source device of a first embodiment.

DESCRIPTION OF EXEMPLARY EMBODIMENTS

Figure 2:
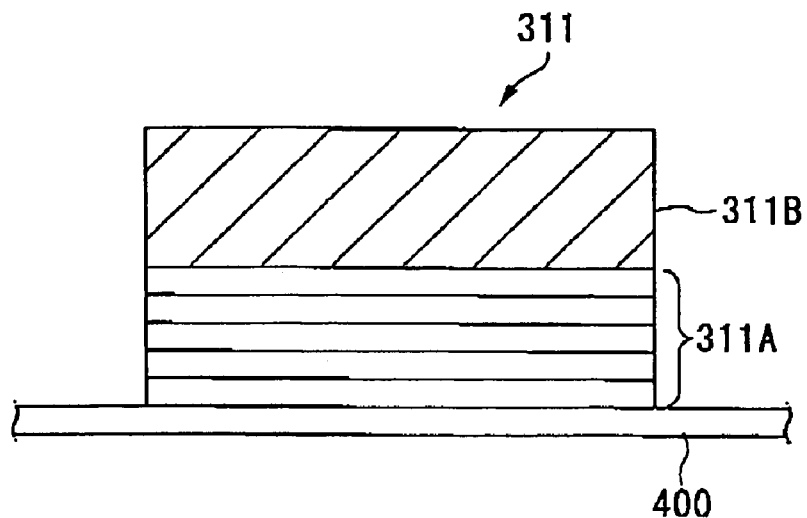
FIG. 2 is a schematic cross-sectional view showing the structure of the laser light source.

Hereinafter, the invention will be described with reference to the accompanying drawings.

The scale of each member in the drawings below has been changed appropriately to sizes that enable each member to be recognized easily.

First Embodiment

FIG. 1A is an exploded perspective view showing a laser light source device of a first embodiment.

FIG. 1B is an enlarged cross-sectional view showing a resonator holding frame, an external resonator, and a base member of the laser light source device of a first embodiment.

FIG. 1C is an enlarged cross-sectional view showing the resonator holding frame of the laser light source device of a first embodiment.

A laser light source device 31 includes a light source 311, an external resonator 313 constituting a resonator structure between the light source 311 and the external resonator 313, a wavelength conversion element 312, and an optical-path conversion element 314.

As shown in FIG. 1A, in the first embodiment, the optical-path conversion element 314 includes a first prism 315 (prism member) and an optical-path separating member 316.

The first prism 315 leads the light emitted from the light source 311 toward the side of the wavelength conversion element 312.

The optical-path separating member 316 leads the light emitted from the wavelength conversion element 312 to be separated.

The optical-path separating member 316 includes a second prism 316a and a selective reflection film (not shown). It detail will be described in detail below.

The laser light source device 31 of the first embodiment includes two first spacing members (base member and resonator holding frame F). The first spacing members hold the wavelength conversion element 312 and the external resonator 313 so that the wavelength conversion element 312 is separated from the external resonator 313 by the predetermined distance described below.

Also, the laser light source device 31 includes second spacing members. The second spacing members hold at least two adjacent optical members so that the at least two adjacent optical members are separated from each other by the predetermined distance. Here, the at least two adjacent optical members are selected from the optical member group consisting of the first prism section 315, the optical-path separating member 316, the light source 311, and the wavelength conversion element 312.

As shown in FIG. 1A, the optical-path conversion element 314, the wavelength conversion element 312, and the external resonator 313 are held by and disposed on a first spacing member, base member Ba with the light source 311.

Particularly, by using the base member Ba, it is possible to prevent misalignment of the wavelength conversion element 312 and the external resonator 313. It is also possible to obtain laser light with a high level of reliability.

The base member Ba includes a first surface Ba1 and a second surface Ba2.

The wavelength conversion element 312 and the optical-path conversion element 314 are held by and disposed on the first surface Ba1. The level of the second surface Ba2 is higher than the level of the first surface Ba1. The external resonator 313 is held by and disposed on the second surface Ba2.

A recessed portion Ba4 is formed on the first surface Ba1. The light source 311 is held by and disposed in the recessed portion Ba4.

The first surface Ba1 is substantially parallel relative to the second surface Ba2.

Furthermore, a side surface Ba5 connects the first surface Ba1 with the second surface Ba2. The side surface Ba5 is formed vertically relative to both the first surface Ba1 and the second surface Ba2.

The wavelength conversion element 312 is formed, for example, in a quadrangular pillar-shaped form. The wavelength conversion element 312 comes in contact with the side surface Ba5, thereby the wavelength conversion element 312 is disposed on the first surface Ba1, and the position of the wavelength conversion element 312 is determined on the base member Ba.

The external resonator 313 is formed in a quadrangular pillar-shaped form similar to the wavelength conversion element 312. The external resonator 313 is held by and disposed on the base member Ba via a first spacing member, a resonator holding frame F.

As shown in FIG. 1C, the resonator holding frame F is primarily L-shaped. Furthermore, the resonator holding frame F includes a horizontal portion F5 and a vertical portion F6. The horizontal portion F5 has a bottom surface F1. The vertical portion F6 has a side surface F2. In addition, the resonator holding frame F causes the external resonator 313 to come into contact with the bottom surface F1 and the side surface F2.

As shown in FIGS. 1B and 1C, a protuberance portion F3 formed in a half spherical form is formed on an opposite side of the bottom surface F1 of the resonator holding frame F. The protuberance portion F3 fits into the recessed portion Ba3 formed on the second surface Ba2 of the base member Ba. The opposite surface of the side surface F2 is come in contact with the wavelength conversion element 312.

By this constitution, the wavelength conversion element 312 and the optical-path conversion element 314 are held by and disposed on the base member Ba in the state (registration) where the wavelength conversion element 312 is separated from the optical-path conversion element 314 by the predetermined distance.

Thus, it is possible to prevent degradation of optical characteristics caused by abrasion due to the surface of the wavelength conversion element 312 and the surface of the external resonator 313 coming in contact with each other.

In conventional constitutions, the wavelength conversion element 312 is connected with the external resonator 313 via an adhesive, thereby causing malfunctioning, such as prohibiting utilization of light, caused by changes in adhesive's quality due to the heat emission of the laser light, or the like.

In contrast, in the laser light source device 31 of the first embodiment, it is possible to prevent the above-described malfunctions from occurring. Furthermore, it is possible to realize miniaturization of the entire device.

In the case in which the resonator holding frame F is constituted by, for example, non-translucent material, it is preferable that the height of the vertical portion F6 of the resonator holding frame F be adjusted in a vertical direction relative to the horizontal portion F5. Specifically, it is preferable that the height of the vertical portion F6 be adjusted so as not to block off the light passing through the optical-path between the wavelength conversion element 312 and the external resonator 313.

By this constitution, it is possible to reliably lead the light emitted from the light source 311 to emit toward the exterior of the laser light source device 31.

When the resonator holding frame F is constituted by translucent material, the amount of transmissivity decreases a little. However, there is no actual problem even if the vertical portion F6 is overlapped in the optical-path.

Thus, in the above-described first embodiment, the base member Ba and the resonator holding frame F function as the first spacing member.

Also, as the constitution of the resonator holding frame F, the constitution in which the resonator holding frame F is integrated into the base member Ba can be adopted.

The optical-path conversion element 314 is attached to the first surface Ba1 of the base member Ba via a second spacing member, an adhesive G which includes gap members so as to cover the light source 311. The light source 311 is held by and disposed in the recessed portion Ba4 which is formed on the first surface Ba1 of the base member Ba.

The size of the gap member corresponds to a predetermined distance, for example, a desired distance. The optical-path conversion element 314 comes in contact with the first surface Ba1 via the gap members. By this constitution, it is possible to maintain the positional relationship in which these members are separated from each other by the predetermined distance.

Also, the adhesive G is disposed between the first prism 315 and the second prism 316a. By this constitution, the positional relationship is maintained between the first prism 315 and the second prism 316a so that the first prism 315 is separated from the second prism 316a by the predetermined distance.

Also, the adhesive G is disposed between the optical-path conversion element 314 and the wavelength conversion element 312. By this constitution, the positional relationship is maintained between the optical-path conversion element 314 and the wavelength conversion element 312 so that the optical-path conversion element 314 is separated from the wavelength conversion element 312 by the predetermined distance.

It is desirable that the adhesive G be formed at a position at which the light passing through the optical-path between the optical members is not blocked off.

Therefore, it is possible to efficiently lead the light emitted from the light source 311 to emit toward the exterior of the laser light source device 31. It is also possible to improve the light utilization efficiency.

In the case in which the gap member is constituted by a translucent material, the amount of transmissivity decreases a little. However, there is no actual problem even if the gap member is overlapped a little in the optical-path.

FIG. 2 is a schematic cross-sectional view showing the structure of the light source 311.

As shown in FIG. 2, the light source 311 emitting laser light is referred to a surface emission-type semiconductor laser. The light source 311 includes, for example, a substrate 400 constituted by a semiconductor wafer, a mirror layer 311A formed on the substrate 400 and functioning as a reflection mirror, and a laser medium 311B laminated on the top surface of the mirror layer 311A.

The mirror layer 311A is constituted by a lamination body including a dielectric having a high refractive index and a dielectric having a low refractive index. These dielectrics are formed on the substrate 400 by, for example, a CVD (Chemical Vapor Deposition) method.

The thickness of each layer constituting the mirror layer 311A, the material of each layer, and number of the layers are optimized depending on the first wavelength of the light emitted from the light source 311. The structure of the mirror layer 311A is optimized so that a high level of light intensity is obtained through interference with and amplification by the reflected light.

The laser medium 311B is formed on the surface of the mirror layer 311A. An electriferous section (circuit, not shown) is connected with the laser medium 311B. The laser medium 311B emits a laser light having a wavelength predetermined by the amount of current applied by the electriferous section.

The laser medium 311B causes the light including the specific wavelength (first wavelength) to be amplified by resonation the light of the first wavelength between the mirror layer 311A and the external resonator 313 as shown in FIGS. 1A to 1C and 2.

Therefore, the light reflected by the mirror layer 311A and the external resonator 313 described below is amplified by resonation with the light newly emitted from the laser medium 311B. By this constitution, the light which has been resonated is emitted from the light emission surface of the laser medium 311B in a direction substantially orthogonal to the substrate 400 or the mirror layer 311A.

Figure 3:
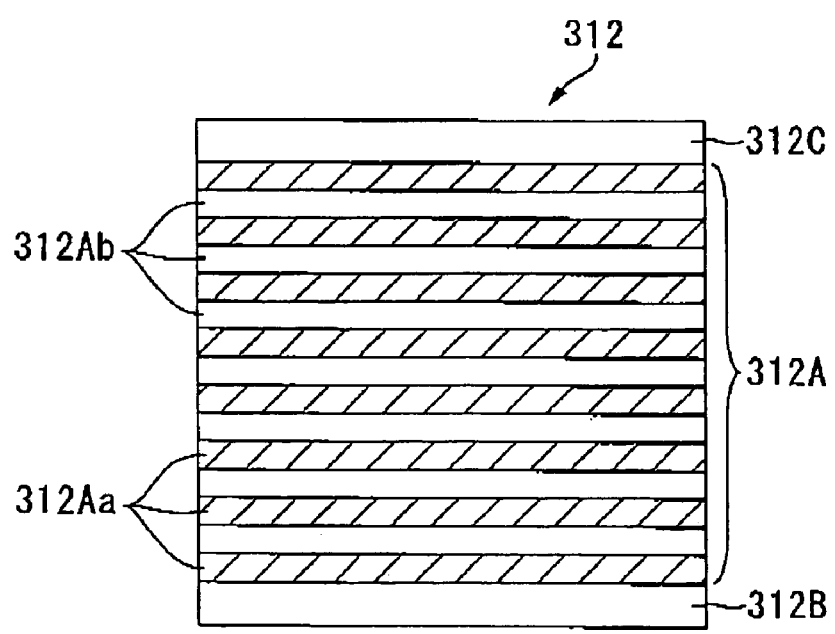
FIG. 3 is a schematic cross-sectional view showing the structure of a wavelength conversion element.

FIG. 3 is a schematic cross-sectional view showing the structure of a wavelength conversion element.

The wavelength conversion element 312 is formed, for example, in a quadrangular pillar-shaped form, and includes a wavelength conversion section 312A and anti-reflective films (AR films) 312B and 312C.

The anti-reflective film 312B is formed on the surface of the wavelength conversion section 312A, which is closer to the light source 311. That is, the anti-reflective film 312B is formed on the incident surface of the wavelength conversion section 312A.

The anti-reflective film 312C is formed on the surface of the wavelength conversion section 312A, which is closer to the external resonator 313. That is, the anti-reflective film 312C is formed on the emission surface of the wavelength conversion section 312A.

The wavelength conversion section 312A is a Second Harmonic Generation element (SHG element) generating second harmonics of the light which is incident to itself.

The wavelength conversion section 312A includes a periodic polarization inversion structure. In the wavelength conversion section 312A, the wavelength of the light which is incident to itself is converted into the substantial half wavelength (second wavelength) of the light due to the wavelength conversion by Quasi Phase Matching (QPM).

In the wavelength conversion by Quasi Phase Matching, a conversion efficiency higher than that of other types of wavelength conversion elements can be obtained.

By this constitution, since the wavelength conversion by Quasi Phase Matching is used, it is possible to further improve the degree of effectiveness of the invention as described below.

For example, when the wavelength (first wavelength) of the light emitted from the light source 311 is 1064 nm (near infrared), the wavelength conversion section 312A converts the first wavelength into a wavelength half as large, which is 532 nm (the second wavelength). By this constitution, the wavelength conversion section 312A generates a green-colored light.

However, as described above, the conventional wavelength conversion efficiency of the wavelength conversion section 312A is approximately 30 to 40%. Thus, all light emitted from the light source 311 in not converted into the second wavelength light.

The periodic polarization inversion structure is formed in a crystal substrate made of an inorganic nonlinear optical material (e.g., lithium niobate ($LiN:LiNbO_3$), lithium tantalate ($LT:LiTaO_3$), or the like).

Specifically, in the periodic polarization inversion structure, a plurality of two types regions 312Aa and 312Ab whose polarization directions are inverted to each other are formed. Also, in the periodic polarization inversion structure, the regions 312Aa and 312Ab are alternately formed by a predetermined distance in a direction substantially orthogonal to the emission direction of the light emitted from the light source 311.

The pitch between the two regions 312Aa and 312Ab are determined by the wavelength of the incidence light and the refractive-index dispersion of the crystal substrate, as needed.

Conventionally, in the laser light oscillated from a semiconductor laser, a plurality of longitudinal modes oscillates in gain-bandwidth, and the wavelength thereof is varied by temperature change or the like.

Therefore, the allowable range of the wavelength of the light, which is converted in the wavelength conversion element 312, is approximately 0.3 nm. The allowable range is varied at approximately 0.1 nm/° C. depending on the temperature at which the laser light is used.

The AR films 312B and 312C are, for example, dielectric films constituted by a single layer or a multilayer. The AR films 312B and 312C both lead the first wavelength light and the second wavelength light to pass therethrough, for example, at a transmissivity greater than 98%.

These AR films 312B and 312C may be omitted because the AR films 312B and 312C are not essential films for achieving the functions of the wavelength conversion element 312.

Thus, the wavelength conversion element 312 can be constituted by only the wavelength conversion section 312A.

The external resonator 313 has the functions as follows.

The external resonator 313 leads the light of the first wavelength to selectively reflect toward the light source 311. The external resonator 313 also leads the light other that of the first wavelength and the light including the second wavelength to pass therethrough.

The external resonator 313 also has the function to narrow the band width of the wavelength of the light which is amplified by leading the light of the first wavelength to be selectively reflected.

Figure 4:
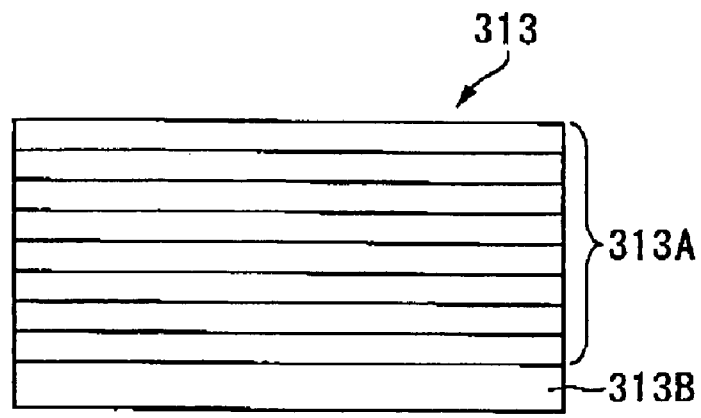
FIG. 4 is a schematic cross-sectional view showing the structure of the external resonator.

FIG. 4 is a schematic cross-sectional view showing the structure of the external resonator.

The external resonator 313 is formed in a quadrangular pillar-shaped form similar to the wavelength conversion element 312.

The external resonator 313 also includes a bragg grating section 313A and an anti-reflective film 313B (AR film). The bragg grating section 313A is the volume phase grating in which a bragg grating structure is formed. The anti-reflective film 313B is formed on the surface of the abragg grating section 313A, which is closer to the wavelength conversion element 312. That is, the anti-reflective film 313B is formed on the incident surface of the bragg grating section 313A.

The bragg grating section 313A is formed in a glass layer so as to laminate the interference patterns having different refractive indexes each other, by radiating ultraviolet light having a predetermined wavelength onto the glass layer constituting a material mainly including $SiO_2$, such as alkali boro-aluminosilicate glass or the like.

Since the external resonator 313 includes the bragg grating section 313A, the functions of the external resonator 313 described above can be obtained.

The AR film 313B is a dielectric film constituted by a single layer or a multilayer. The AR film 313B leads both the first wavelength light and the second wavelength light to pass therethrough, for example, at a transmissivity greater than 98%.

In this embodiment, the AR film 313B is formed at the incident surface of the bragg grating section 313A. However, the AR film 313B can be formed at the emission surface of the bragg grating section 313A.

The AR film 313B may be omitted because the AR film 313B is not an essential film for achieving the functions of the external resonator 313.

Thus, the external resonator 313 can be constituted by only the bragg grating section 313A.

Figure 5:
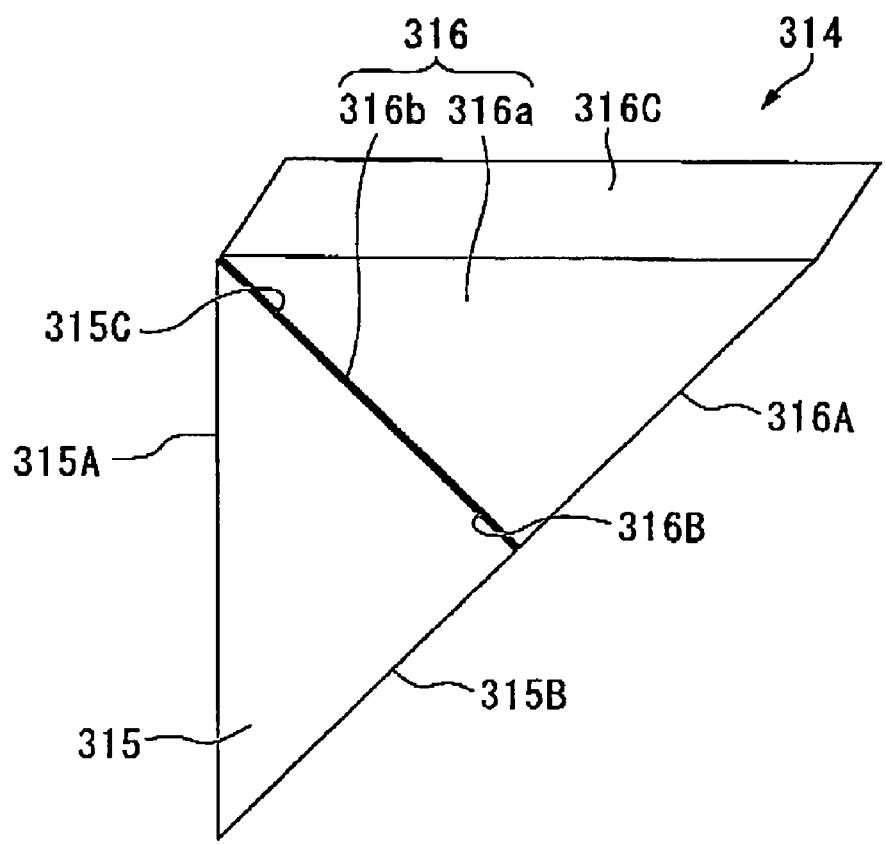
FIG. 5 is a perspective view showing an optical-path conversion element.

FIG. 5 is a perspective view showing an optical-path conversion element.

As shown in FIG. 5, the optical-path conversion element 314 includes the first prism (prism member) 315 and the optical-path separating member 316 as described above.

The first prism 315 leads the light emitted from the light source 311 toward the wavelength conversion element 312.

The optical-path separating member 316 leads the light emitted from the wavelength conversion element 312 to be separated.

The optical-path separating member 316 includes a second prism 316a and a selective reflection film 316b. The selective reflection film 316b is formed between the second prism 316a and the first prism 315.

In the description described below, the first prism 315 and the second prism 316a may by referred to prisms 315 and 316a, respectively.

The prism 315 is made of an optical glass such as BK7 or the like, in an isosceles triangular pillar-shaped form.

The prism 315 has three side surfaces constituting surfaces 315B and 315C which sandwich the vertex angle of the isosceles triangular, and a surface 315A being the oblique side.

The second prism 316a constituting the optical-path separating member 316 is made of an optical glass such as BK7 or the like similar to the first prism 315, in an isosceles triangular pillar-shaped form.

The prism 316a has three side surfaces constituting surfaces 316A and 316B which sandwich the vertex angle of the isosceles triangular, and a surface 316C being the oblique side.

The selective reflection film 316b is formed on the surface 316B of the prism 316a.

The selective reflection film 316b is formed of, for example, a dielectric multilayer.

The dielectric multi layer can be formed by, for example, a CVD (Chemical Vapor Deposition) method.

The thickness of each layer constituting the multi layer, the material of each layer, and the number of layers are optimized depending on the requirements of the device.

The selective reflection film 316b is positioned between the light source 311 and the wavelength conversion element 312 in the optical-path. The selective reflection film 316b has characteristics as follows.

That is, the selective reflection film 316b leads the light whose wavelength has been converted by the wavelength conversion element 312 to selectively reflect. The selective reflection film 316b also leads the light of the first wavelength whose wavelength has not been converted, to pass therethrough.

Thus, the selective reflection film 316b includes the functions of a dichroic mirror.

In the selective reflection film 316b, it is preferable that the transmissivity relative to the light of the first wavelength and the reflectance relative to the light including the second wavelength be high. It is sufficient that the degree of the transmissivity and the reflectance are greater than 80%.

The surface 315C of the first prism 315 is connected to the surface 316B of the prism 316a on which the selective reflection film 316b is formed, via an optical adhesive including the above-described gap member. The optical adhesive is, for example, an adhesive curable by ultraviolet light.

The surface 316C is disposed so that a part of the surface 316C faces towards the wavelength conversion element 312.

Figure 6:
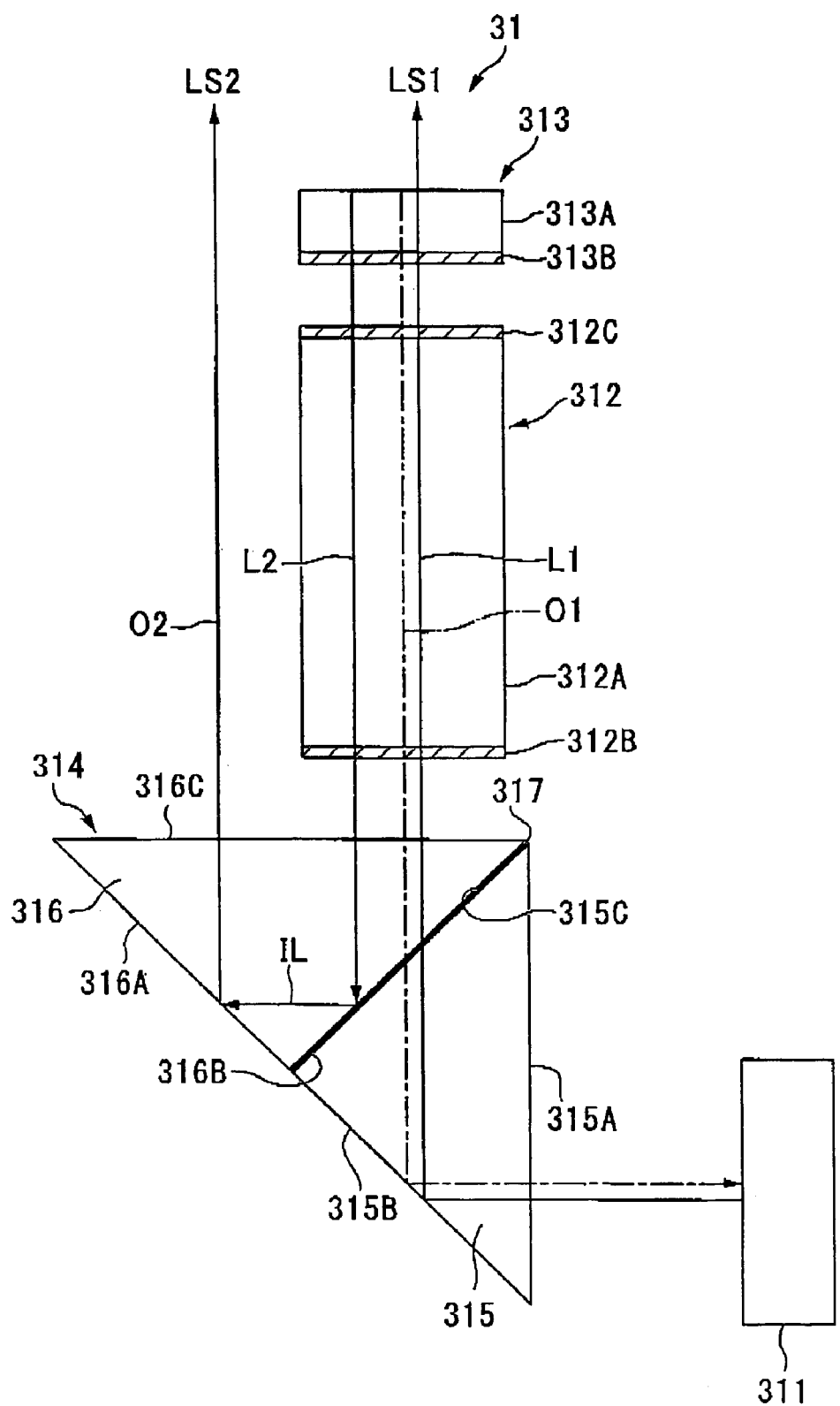
FIG. 6 is a schematic view showing the laser light source device.

As shown in FIG. 6, the surface 316A is a flat surface and is disposed at the angle so that the total reflection condition relative to the incidence light IL is obtained.

In this structure, by disposing the surface 316A, which is a flat surface, at the angle at which the total reflection condition relative to the incidence light IL is obtained, it is possible to increase the reflection efficiency of the reflection surface to approximately 100%. In addition, it is also possible to improve the utilization efficiency of the light.

A reflection film may be formed on the surface 316A. By this constitution, the second laser light LS2 shown in FIG. 6 may be led in substantially same direction as the emission direction of the first laser light LS1.

In this structure, there is a possibility that the reflection efficiency may slightly decrease. However, it is not necessity to dispose the surface 316A at an angle at which the total reflection condition is obtained in this structure. Therefore, the degree of freedom of designing the optical-path increases.

The prisms 315 and 316 are integrated into a unit body by the above-described connection. The prisms 315 and 316 may be integrated into a unit body by another connection method.

In this embodiment, the selective reflection film 316b is formed on the surface 316B of the prism 316a. However the selective reflection film 316b may also be formed on the surface 315C of the prism 315.

In short, it is sufficient that the selective reflection film 316b be formed between the surface 315C of the prism 315 and the surface 316B of the prism 316a.

In this case, the optical-path conversion element 314 is constituted by the first prism and the selective reflection film.

In addition, an anti-reflective film (AR film) may be formed on the surface 315A of the prism 315 and the surface 316C of the prism 316a.

By forming the AR films on these surfaces, it is possible to decrease the light loss when the light is incident to the optical-path conversion element 314 via the AR film or when the light is emitted from the optical-path conversion element 314 via the AR film.

The process in which the light which has been emitted from the laser light source device 31 is obtained as an output light will be described with reference to the accompanying drawings.

FIG. 6 is a schematic view showing the laser light source device 31.

The laser light source device 31 includes the light source 311, the wavelength conversion element 312, the external resonator 313, and the optical-path conversion element 314 as described above.

The light source 311 emits light including that of the first wavelength.

In FIG. 6, the base member Ba, the resonator holding frame F, and the adhesive including the gap member as described above are omitted.

In FIG. 6, reference numeral L1 indicates the light which has been emitted from the light source 311, which has been converted into the second wavelength light by the wavelength conversion element 312, and which is emitted from the external resonator 313 as the first laser light LS1.

An optical-path O1 is the optical-path of the light which has not been converted into the second wavelength light by the wavelength conversion element 312 after emission from the light source 311, which also has not been converted into the second wavelength light by the wavelength conversion element 312 in the processes from the reflection by the external resonator 313 to the returning to the light source 311, and which is returned to the light source 311 by passing the selective reflection film 316b.

It is possible for the optical-path O1 to be formed by the above-described light.

As shown in FIG. 6, the external resonator 313 is formed on the first optical-path O1 so as to be disposed substantially orthogonal to the first optical-path O1.

Furthermore, the incident surface of the external resonator 313 faces towards the emission surface of the wavelength conversion element 312.

In addition, the bragg grating section 313A is constituted by a plurality of layers formed along the optical-path O1.

Reference numeral L2 indicates the light which has been emitted from the light source 311, which has not been converted into the second wavelength light by the wavelength conversion element 312, which has been converted into the second wavelength light by the wavelength conversion element 312 in the processes from the reflection by the external resonator 313 to the return to the light source 311, and which is incident to the selective reflection film 316b.

In FIG. 6, reference numerals L1, O1, and L2 appropriately indicate the different positions. However, the lights and the optical-path reference numerals L1, O1, and L2 refer to actually exist at identical positions.

The light source 311 emits light of the first wavelength when a current is applied to the laser medium 311B.

The light of the first wavelength emitted from the light source 311 is incident to the surface 315A of the prism 315. In this manner, the light is incident to the optical-path conversion element 314. After the light was totally reflected by the surface 315B of the prism 315, the light passes through the surface 315C of the prism 315, passes through the selective reflection film 316b and the surface 316B of the prism 316a in sequence, and emits from the surface 316C of the prism 316a toward the wavelength conversion element 312.

The light of the first wavelength emitted from the optical-path conversion element 314 is incident to the wavelength conversion element 312.

In the wavelength conversion element 312, a part of the incident light of the first wavelength is converted into a light including a light with the second wavelength which is half of that of the first wavelength.

In the light emitted from the wavelength conversion element 312, the light that has a wavelength which has been converted into the second wavelength passes through the external resonator 313, and emits from the external resonator 313 as the first laser light LS1.

Additionally, in the light emitted from the wavelength conversion element 312, the light which has not been converted into light of the second wavelength (including light of the first wavelength) is reflected by the external resonator 313 toward the light source 311.

The light of the first wavelength which has been reflected by the external resonator 313 re-passes through the wavelength conversion element 312 while returning to the light source 311. In addition, a part of the light is converted into light of the second wavelength.

The light emitted from the wavelength conversion element 312 toward the light source 311 is incident to the optical-path conversion element 314 via the surface 316C of the prism 316a, and is incident to the selective reflection film 316b.

In the light which has been incident to the selective reflection film 316b in this manner, the light of the light of the first wavelength passes through the selective reflection film 316b.

The light of the first wavelength which has passed through the selective reflection film 316b passes the surface 315C of the prism 315. After total reflection by the surface 315B of the prism 315, the light is emitted from the surface 315A of the prism 315 toward the light source 311.

Then, the light is returned to the light source 311, reflected by the mirror layer 311A, and re-emitted from the light source 311.

As described above, the light of the first wavelength oscillates on the first optical-path O1 formed between the light source 311 and the external resonator 313. In this manner, the light is amplified by resonation with the light newly oscillated in the laser medium 311B.

That is, the laser light source device 31 includes a resonator structure formed between the mirror layer 311A of the light source 311 and the external resonator 313.

The light, which has been converted into light of the second wavelength by the wavelength conversion element 312 while returning to the light source 311, is reflected by the selective reflection film 316b.

In addition, the light is reflected by the surface 316A of the prism 316a, which is a reflective surface. The reflected light is thereby led in a direction substantially parallel to the emission direction of the first laser light LS1.

Furthermore, the light reflected by the surface 316A is emitted from the surface 316C of the prism 316a as a second laser light LS2.

That is, the optical-path conversion element 314 has the functions as follows.

That is, the optical-path conversion element 314 extracts the light, which has been converted into the second wavelength while returning to the light source 311 due to the reflection by the external resonator 313, from the first optical-path O1 to the second optical-path O2 which is different from the first optical-path O1.

In addition, in the limited cases in which the above-described functions are achieved, the structure including prisms formed in forms other than the above-described first prism 315 and second prism 316a may be used as the optical-path conversion element 314.

In conventional laser light source devices, by disposing an external resonator at the position at which the light emitted from a laser light source is focused, utilization efficiency of the light can be improved.

Furthermore, by extending the length of the optical-path of the wavelength conversion element, wavelength conversion efficiency can be improved.

Thus, in laser light source devices, it is desirable that the length of the optical-path in the direction of the laser light of the wavelength conversion element be as great as possible. Therefore, it is necessary to narrow the distance between the optical members (wavelength conversion element and optical-path separating member) which are disposed between the laser light source and the external resonator.

In the laser light source device 31 of the first embodiment, it is possible to obtain the effects described below.

(1) Since the laser light source device 31 includes the base member Ba and the resonator holding frame F as the first spacing member, it is possible to maintain positional relationship in which the wavelength conversion element 312 is separated from the external resonator 313 by the predetermined distance.

It is thereby possible to prevent degradation of the optical characteristics caused by abrasion due to the surface of the wavelength conversion element 312 and the surface of the external resonator 313 coming into contact with each other.

Furthermore, in conventional constitutions, whose optical members (e.g., optical-path conversion element 314, wavelength conversion element 312, and external resonator 313) are connected with each other via an adhesive, malfunctioning can occur due to a changing of the adhesive's qualities due to the heat emission of the laser light, or the like. In contrast, in the laser light source device 31 of the first embodiment, it is possible to prevent the above-described malfunctioning from occurring.

In addition, it is possible to improve miniaturization of the laser light source device 31, and to enlarge the size of the wavelength conversion element 312 which is disposed between the light source 311 and the external resonator 313. It is thereby possible to improve the wavelength conversion efficiency by extending the length of the optical-path of the wavelength conversion element 312.

Therefore, it is possible to realize miniaturization of the constitution of the laser light source device 31, and to improve light utilization efficiency.

Furthermore, the positional relationship in which the optical members (prism member 315, optical-path separating member 316, light source 311, and wavelength conversion element 312) are separated from each other by the predetermined distance is maintained by the adhesive including the gap member (second spacing member). Therefore, especially, in the case of the first embodiment where the optical-path conversion element 314 is disposed between the light source 311 and the wavelength conversion element 312, it is possible to obtain a high wavelength conversion efficiency.

(2) In the resonator structure (first optical-path O1) constituted by the light source 311 and the external resonator 313, the wavelength conversion element 312 is disposed. By this constitution, in the process where the light is reflected by the external resonator 313 and the light returns to the light source 311, the second laser light whose wavelength has been converted is extracted from the first optical-path O1 to the second optical-path O2. By utilizing the extracted second laser light, it is possible to efficiently prevent power reduction of the output light.

Furthermore, the wavelength conversion element 312 is disposed in the inner resonator structure constituted by the light source 311 and the external resonator 313. By this constitution, a structure is not necessary to prevent the return of the light to the light source 311, the light having not been converted into a light of the second wavelength while returning to the light source 311 due to the reflection by the external resonator 313.

Thus, there is little concern that the optical system will continue to increase in size, and it is possible to decrease the light loss caused by extending the length of the optical-path or by increasing the number of times it passes through the optical elements.

Furthermore, it is sufficient that the second laser light LS2 is led only in substantially in the same direction as the emission direction of the first laser light LS1. It is thereby possible to obtain output light in which the polarization directions are almost identical.

When the laser light source device 31 is thereby used in combination with a polarization-controller-type device (e.g., liquid crystal device), it is possible to improve the light utilization efficiency.

(3) Since it is possible to make the light incident to the optical-path conversion element 314 via the surfaces 315A and 316A of the prisms 315 and 316, and since it is possible to cause the light to emit from the optical-path conversion element 314, it is possible to easily control the direction of the light which is incident to the optical-path conversion element 314 and the direction of the light which is emitted from the optical-path conversion element 314.

(4) There is a high possibility that the laser light source device 31 of the first embodiment will be used in combination with other optical devices such as diffusion optical members, lenses, filters, mirrors, diffraction gratings, prisms, light modulation elements, and the like.

However, the characteristics of these optical devices are variable depending on the angle of the incidence light or output results.

In contrast, in the laser light source device 31 of the first embodiment, the second laser light LS2 is substantially parallel to the first laser light LS1 emitted from the external resonator 313. Therefore, it is easy to design an optical device or to determine the position of an optical device, which is disposed behind the laser light source device 31.

Therefore, when the laser light source device 31 of the first embodiment is applied to an image display device, a monitor, or the like, it is possible to obtain effects where the degree of freedom designing the optical-path increases dramatically.

Second Embodiment

Figure 7:
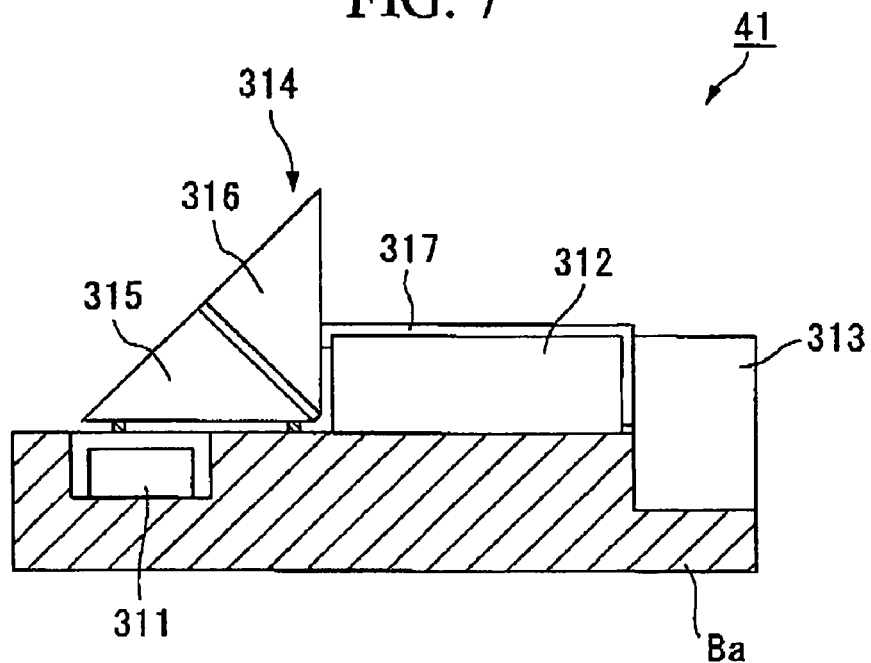
FIG. 7 is a schematic view showing a laser light source device of a second embodiment.

FIG. 7 is a schematic view showing a laser light source device 41 of a second embodiment.

In the laser light source device 41 of the second embodiment, the constitution of the first spacing member and the second spacing member are different from that of the laser light source device 31 of the first embodiment. The constitution of the other parts of the laser light source device 41 is identical to the laser light source device 31 of the first embodiment.

Therefore, in FIG. 7, identical symbols are used for the elements which are identical to those of the first embodiment, and the explanations thereof are omitted or simplified.

Also, the process in which the light which has been emitted from the laser light source device 41 is obtained as an output light is identical to the laser light source device 31 of the first embodiment, and the explanations are omitted or simplified.

Specifically, the laser light source device 41 includes a thermal diffusion plate 317 radiating the heat generated from the wavelength conversion element 312 toward an exterior.

In the thermal diffusion plate 317, a thermistor (not shown) measuring the temperature of the wavelength conversion element 312 or a heater (not shown) controlling the temperature of the wavelength conversion element 312 are formed.

In the second embodiment, the first spacing member and a part of the second spacing member are integrated into the thermal diffusion plate 317.

Figure 8A:
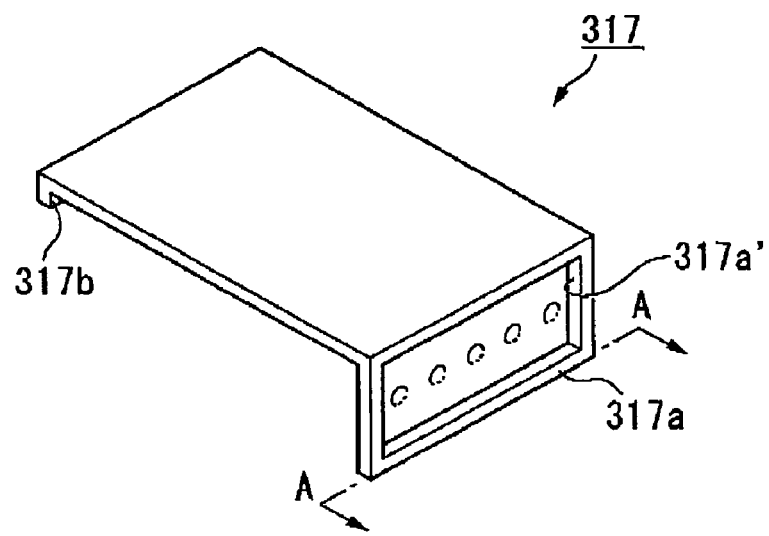
FIG. 8A is a schematic perspective view showing the structure of a thermal diffusion plate.
Figure 8B:
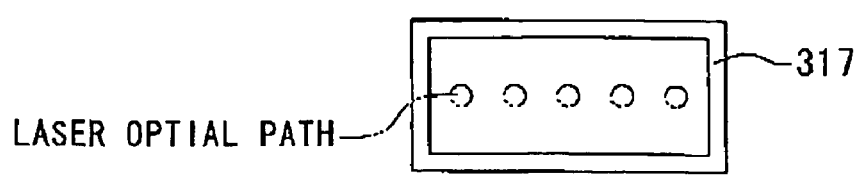
FIG. 8B is a side view showing the thermal diffusion plate.

FIG. 8A is a schematic perspective view showing the structure of a thermal diffusion plate 317, and FIG. 8B is a side view showing the thermal diffusion plate 317.

A second spacing portion 317b holds the wavelength conversion element 312 and the optical-path conversion element 314 so that the wavelength conversion element 312 is separated from the optical-path conversion element 314 by a predetermined distance.

Also, a first spacing portion 317a holds the external resonator 313 and the wavelength conversion element 312 so that the external resonator 313 is separated from the wavelength conversion element 312 by a predetermined distance.

In the second embodiment, the first spacing member and the second spacing member are not disposed in an optical-path, similar to the above-described embodiment.

Specifically, an opening 317a' is formed on the first spacing portion 317a, and a laser optical-path passes inside the opening 317a'.

Furthermore, as shown in FIG. 7, the second spacing portion 317b projects so as not to intersect the laser optical-path.

Since the laser light source device 41 includes the constitution in which the first spacing portion 317a and the second spacing portion 317b do not intersect the laser optical-path, it is possible to extract the light from the light source 311 toward the exterior. It is thereby possible to improve the light utilization efficiency.

In the above-described embodiment, the positional relationship is maintained in which the optical-path conversion element 314 and the wavelength conversion element 312 are disposed at the predetermined position by the thermal diffusion plate 317. However, this constitution of the invention shall not be limited to the above embodiment. For example, the second spacing member, which maintains the first prism 315 and the optical-path separating member 316 constituting the optical-path conversion element 314 at predetermined positions, may be integrated into the thermal diffusion plate.

In the laser light source device 41 of the second embodiment, it is possible to obtain the effects described below in addition to the above-described effects (1) to (4) of the first embodiment.

Since the first spacing portion 317a and the second spacing portion 317b are integrated into the thermal diffusion plate 317, it is possible to miniaturize the entire structure of the laser light source device 41. Therefore, it is possible to improve weight reduction and cost reduction in the laser light source device 41.

Third Embodiment

Figure 9:
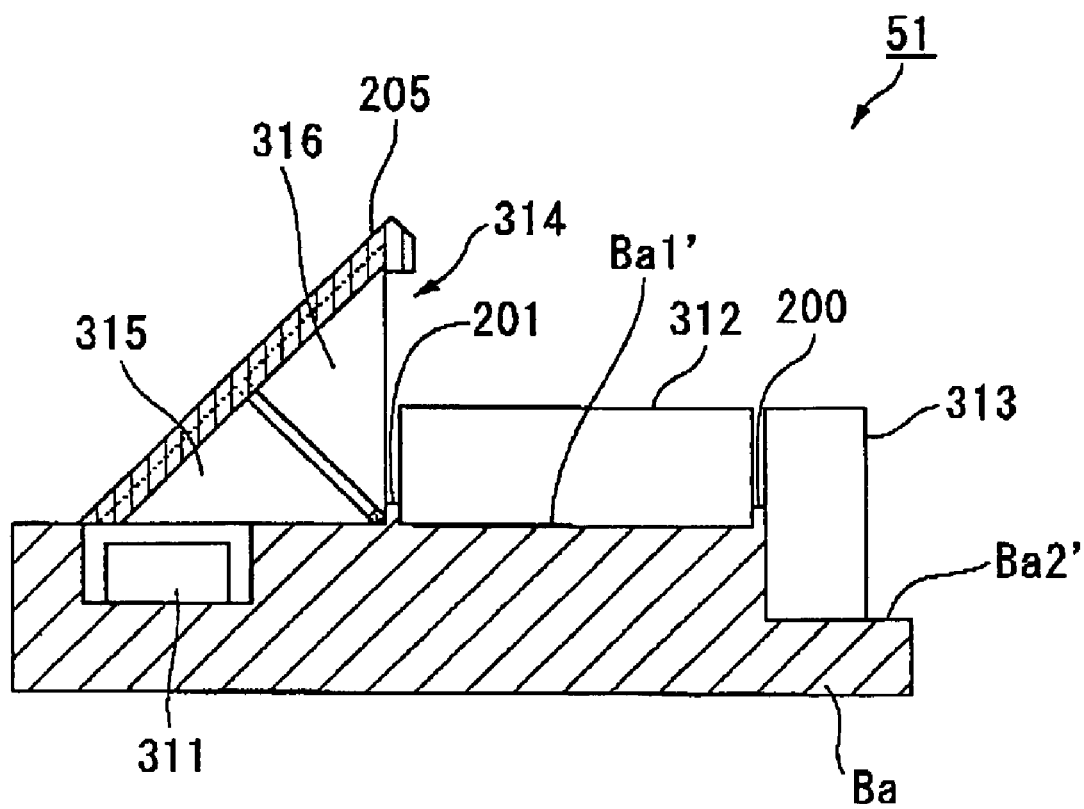
FIG. 9 is a schematic cross-sectional view showing a laser light source device of a third embodiment.

FIG. 9 is a schematic cross-sectional view showing a laser light source device 51 of a third embodiment.

In the laser light source device 51 of the third embodiment, the constitution of the first spacing member and the second spacing member is different from that of the laser light source devices 31 and 41 of the first and second embodiments. The other constitution of the laser light source device 51 is identical to the laser light source devices 31 and 41 of the first and second embodiments.

Therefore, in FIG. 9, identical symbols are used for the elements which are identical to those of the first and second embodiments, and the explanations thereof are omitted or simplified.

Also, the process in which the light which has been emitted from the laser light source device 51 is obtained as an output light is identical to the laser light source devices 31 and 41 of the first and second embodiments, and the explanations are omitted or simplified.

Specifically, in the laser light source device 51 of third embodiment, as shown in FIG. 9, the first spacing member and a part of the second spacing member are integrated into the base member Ba.

In this constitution, it is possible to improve miniaturization of the entire laser light source device.

Figure 10A:
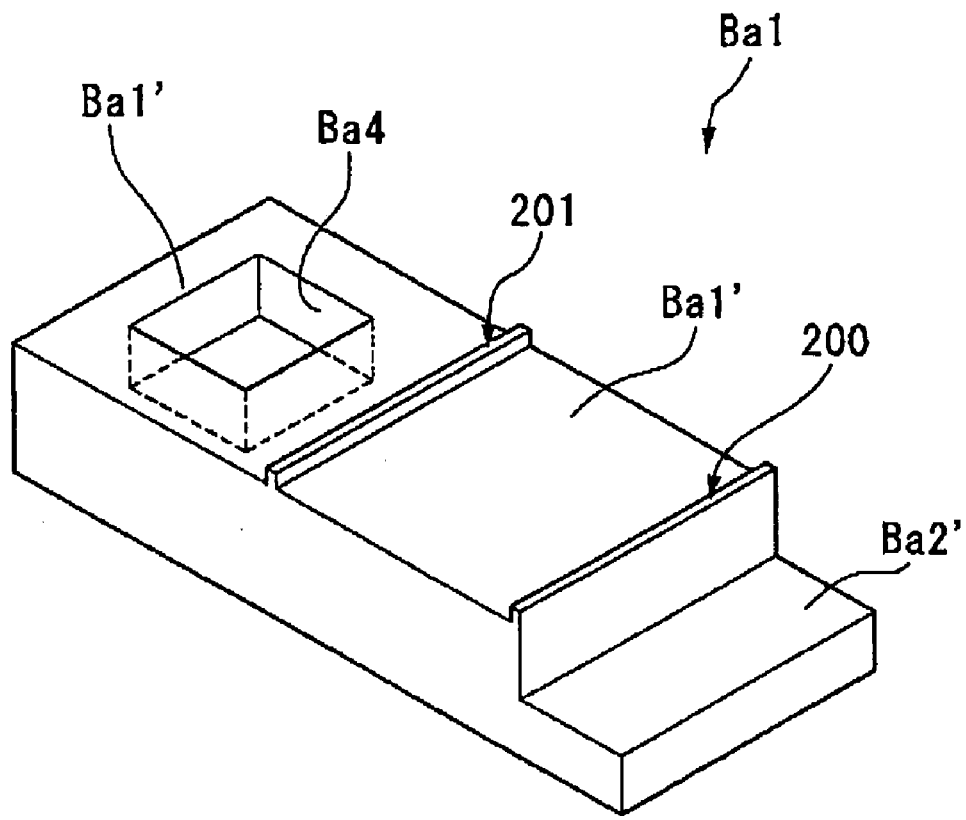
FIG. 10A is a schematic view showing a base member.
Figure 10B:
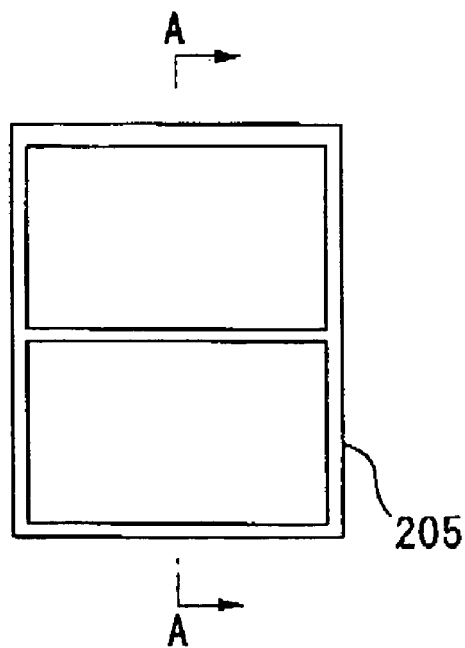
FIG. 10B is a plan view showing a unit holding member integrating optical members into a unit member.
Figure 10C:
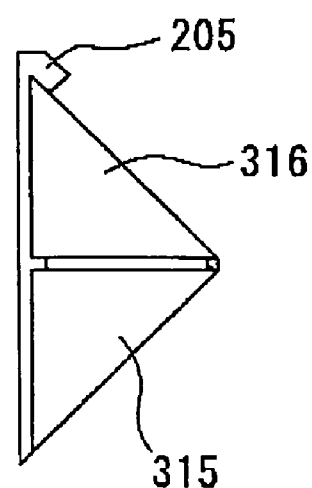
FIG. 10C is a cross-sectional view showing the unit holding member taken along the line A-A shown in FIG. 10B.

FIG. 10A is a schematic view showing a base member Ba. FIG. 10B is a plan view showing a unit holding member 205 causing optical members to be integrated into a unit member. FIG. 10C is a cross-sectional view showing the unit holding member 205 taken along the line A-A shown in FIG. 10B.

As shown in FIG. 10A, the base member Ba of the third embodiment includes a first surface Ba1' holding an optical-path conversion element 314 and a wavelength conversion element 312, and a second surface Ba2' holding an external resonator 313.

In the third embodiment, the height of the first surface Ba1' is taller than the height of the second surface Ba2'.

In addition, a protuberance portion 200 is formed at a boundary portion between the first surface Ba1' and the second surface Ba2'. When the external resonator 313 and the wavelength conversion element 312 come in contact with the protuberance portion 200, the protuberance portion 200 maintains the positional relationship where the wavelength conversion element 312 is separated from the external resonator 313 by the predetermined distance. The protuberance portion 200 functions as the first spacing member.

In addition, a protuberance portion 201 is formed at a portion of the first surface Ba1' closer to the recessed portion Ba4. The protuberance portion 201 maintains the positional relationship in which the wavelength conversion element 312 is separated from the optical-path conversion element 314 by the predetermined distance. An end surface of the wavelength conversion element 312 closer to the optical-path conversion element 314 comes in contact with the protuberance portion 201. The protuberance portion 201 functions as the second spacing member.

Thus, the position of the wavelength conversion element 312 on the base member Ba is determined by the protuberance portions 200 and 201 formed on the first surface Ba1'.

Furthermore, the laser light source device 51 includes a unit holding member 205 causing an optical-path conversion element 314 (optical member) to be integrated into a unit member as shown in FIGS. 9, 10B, and 10C.

Specifically, the unit holding member 205 maintains the positional relationship in which the first prism section 315 is separated from the optical-path separating member 316 by the predetermined distance and also causes the first prism section 315 and the optical-path separating member 316 to be integrated into the unit member. That is, the optical-path conversion element 314 which is constituted by the first prism section 315 and the optical-path separating member 316 can be handled as a unit member.

Therefore, since the laser light source device 51 includes the unit holding member 205, it is possible to reduce the number of members which are handled in manufacturing the laser light source device. The manufacturing efficiency is thereby improved, and it is possible to reduce the cost of the laser light source device.

Modified Example of Laser Light Source Device

The invention shall not be limited to the first and second embodiments. As a matter of course, the invention may include various modifications of the embodiment in a scope not deviating from the spirit of this invention.

In the constitution described below as a modified example, it is also possible to obtain the same effects as the above-described embodiments.

The laser light source devices are described above, which include the optical-path conversion element 314 separating the light in the second optical-path from the light in the first optical-path. In the optical-path conversion element 314, the first optical-path light whose wavelength has been converted while returning to the light source 311 reflection from the external resonator 313 is separated.

Figure 11:
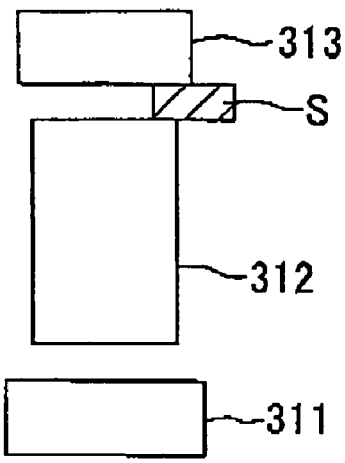
FIG. 11 is a schematic view showing the structure of a laser light source device of a modified example.

However, the invention can also be applied to a laser light source device, as shown in FIG. 11, which does not have an optical-path conversion element.

The laser light source device as shown in FIG. 11 includes the light source 311, the wavelength conversion element 312, and the external resonator 313. A spacer S (first spacing member) is disposed between the wavelength conversion element 312 and the external resonator 313.

In this case, miniaturization of the constitution of the laser light source device is realized, and it is possible to obtain a laser light source device having a high light utilization efficiency.

Instead of the above-described surface emission-type semiconductor laser, as the light source 311, a laser light source such as an edge-emitting-type laser or a solid laser excited by laser diodes can be used.

When using the edge-emitting-type laser, it is preferable that a lens causing the light emitted from the light source 311 to collimate be disposed between the light source 311 and the optical-path conversion element 314.

As the light source 311, a laser light source including a plurality of arrayed emission sections may be used.

Figure 12A:
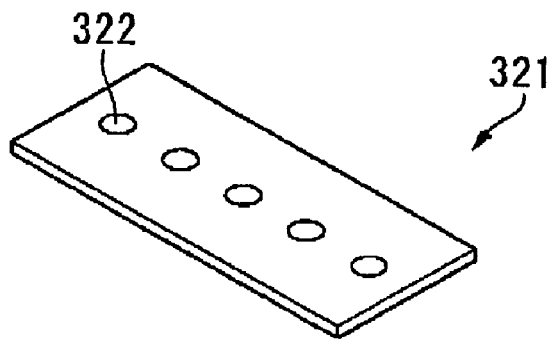
FIGS. 12A and 12B are schematic views showing the structure of emission sections of a modified example.
Figure 12B:
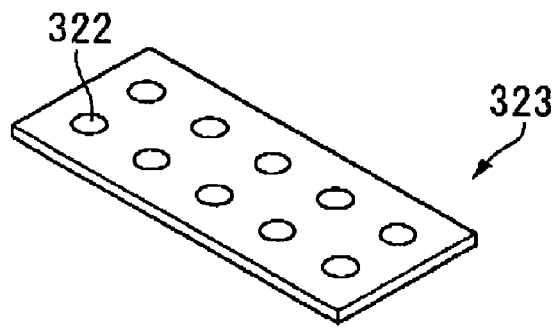

FIGS. 12A and 12B are schematic views showing the structure of emission sections of a modified example.

In the laser light source 321 as shown in FIG. 12A, a plurality of emission sections 322 is arrayed in a line.

In the laser light source 323 as shown in FIG. 12(B), a plurality of emission sections 322 is also arrayed in two lines.

The number of emission sections and the number of lines of emission sections are not limited to that shown in FIGS. 12A and 12B.

When the light source including the arrayed emission sections is applied to the above-described laser light source devices 31, 41, and 51, the area of the emission surface or the incident surface, of the selective reflection film, the reflection surface, the wavelength selective element, and the external resonator, is suitably extended as needed depending on the area of the arrayed emission sections.

Therefore, in the above-described laser light source devices 31, 41, and 51, even if the light source includes the arrayed emission sections, the laser light source devices 31, 41, and 51 do not need to be increased in size, and it is possible to utilize the simple constitution.

Therefore, in the above-described laser light source devices 31, 41, and 51, even if the light source includes the arrayed emission sections, power reduction of the output light can be efficiently suppressed, light utilization efficiency can be improved, the polarization direction of the output light can be completed, and the output can be stabilized. It is also possible to efficiently improve the output power of the output light by increasing amount light by arraying emission sections, in addition to the above-described effects.

In the above explanation, as the nonlinear optical material constituting the wavelength conversion element 312, materials such as LN ($LiNbO_3$) or LT ($LiTaO_3$) are used. As for the other materials constituting the wavelength conversion element 312, inorganic nonlinear optical material such as $KNbO_3$, BNN ($Ba_2NaNb_5O_{15}$), KTP ($KTiOPO_4$), KTA ($KTiOAsO_4$), BBO ($\beta$-$BaB_2O_4$), LBO ($LiB_3O_7$), and the like can be used.

Furthermore, low-molecular organic material such as met-anitroaniline, 2-methyl-4-nitroaniline, chalcone, dicyanovinylanisole, 3,5-dimethyl-1-(4-nitrophenyl)pyrazole, N-methoxymethyl-4-nitroaniline, or the like, or organic nonlinear optical material such as poled polymer or the like may be used.

As the wavelength conversion element 312, a Third Harmonic Generation element may be used instead of the above-described SHG element.

As the external resonator 313, not only the above-described volume phase grating, but also a crystal-type volume hologram, a Photopolymer volume hologram, a blazed diffraction grating (diffraction grating whose groove is formed in a serration form in a cross-sectional view), or the like may be used.

Illumination Device

As example of the constitution of an illumination device of an embodiment of the invention, such as the constitution of the illumination device 500 to which, for example, the above-described laser light source device 41 is applied, will be described below.

Figure 13:
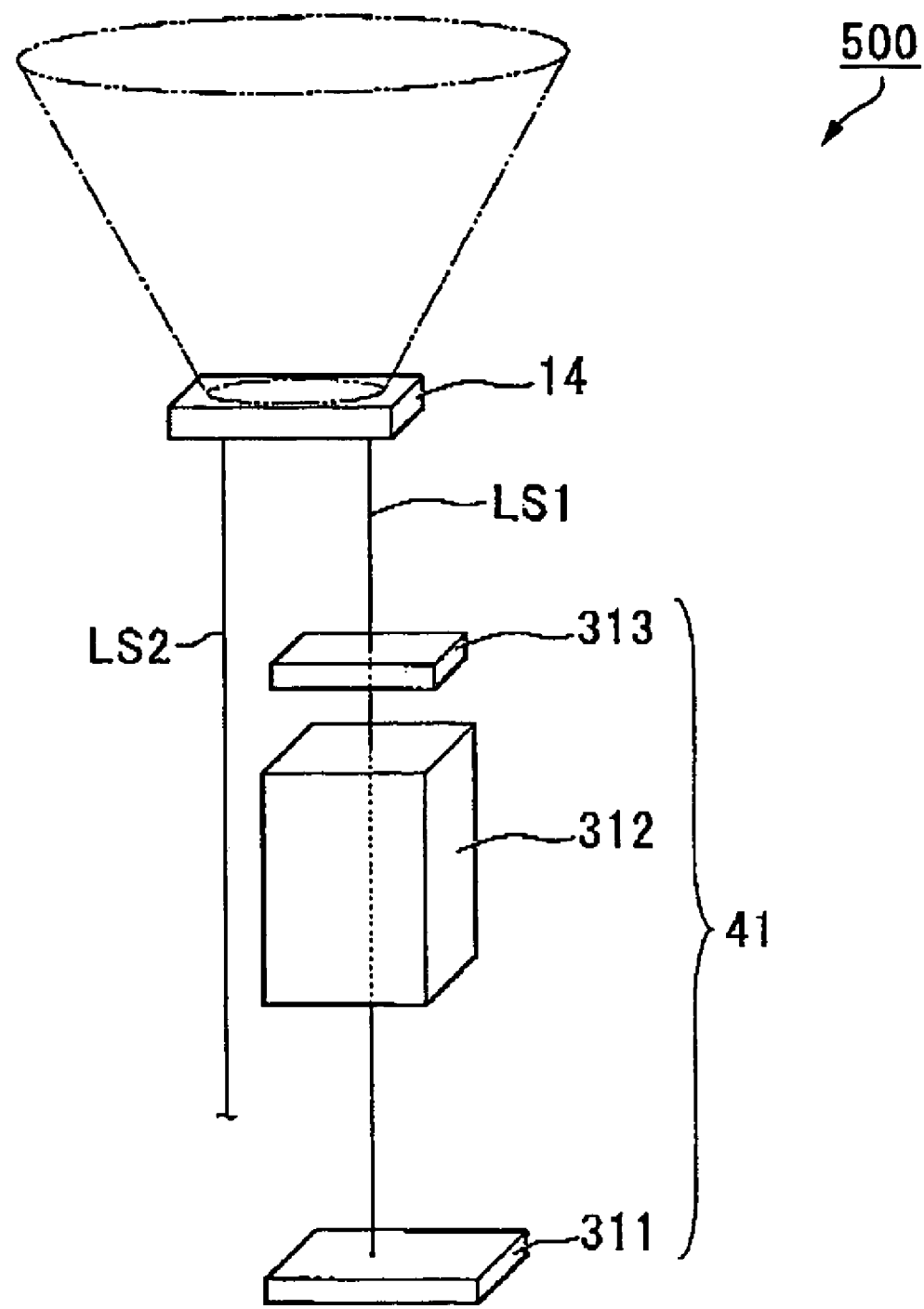
FIG. 13 is a schematic view showing an illumination device.

FIG. 13 is a schematic view showing an illumination device 500.

The optical-path conversion element is omitted in the FIG. 13.

As shown in FIG. 13, the illumination device 500 includes the laser light source device 41, and a diffusing element 14 diffusing the light emitted from the laser light source device 41 and uniformizing the illumination distribution of the laser light.

The diffusion optical member 14 is constituted by a hologram element.

As the hologram element, a computer generated hologram (CGH) may be used on the basis of calculation using a calculator. The computer generated hologram is formed with interference fringes, which are artificially created on a hologram plate.

The computer generated hologram is suitable because a divided region of a diffraction grating can be freely set, and aberration does not therefore occur.

According to the illumination device 500 of the third embodiment, since the illumination device 500 includes the laser light source device 41 in which miniaturization of the device can be realized and which has high light utilization efficiency, it is possible to create a device in which miniaturization and high performance are realized, and which can illuminate a projection object with light having a clear and uniform illumination distribution.

Image Display Device

As an image display device of an embodiment, a constitution of the projector 3 to which the illumination device 500 including the above-described laser light source device is applied, will be described below.

Figure 14:
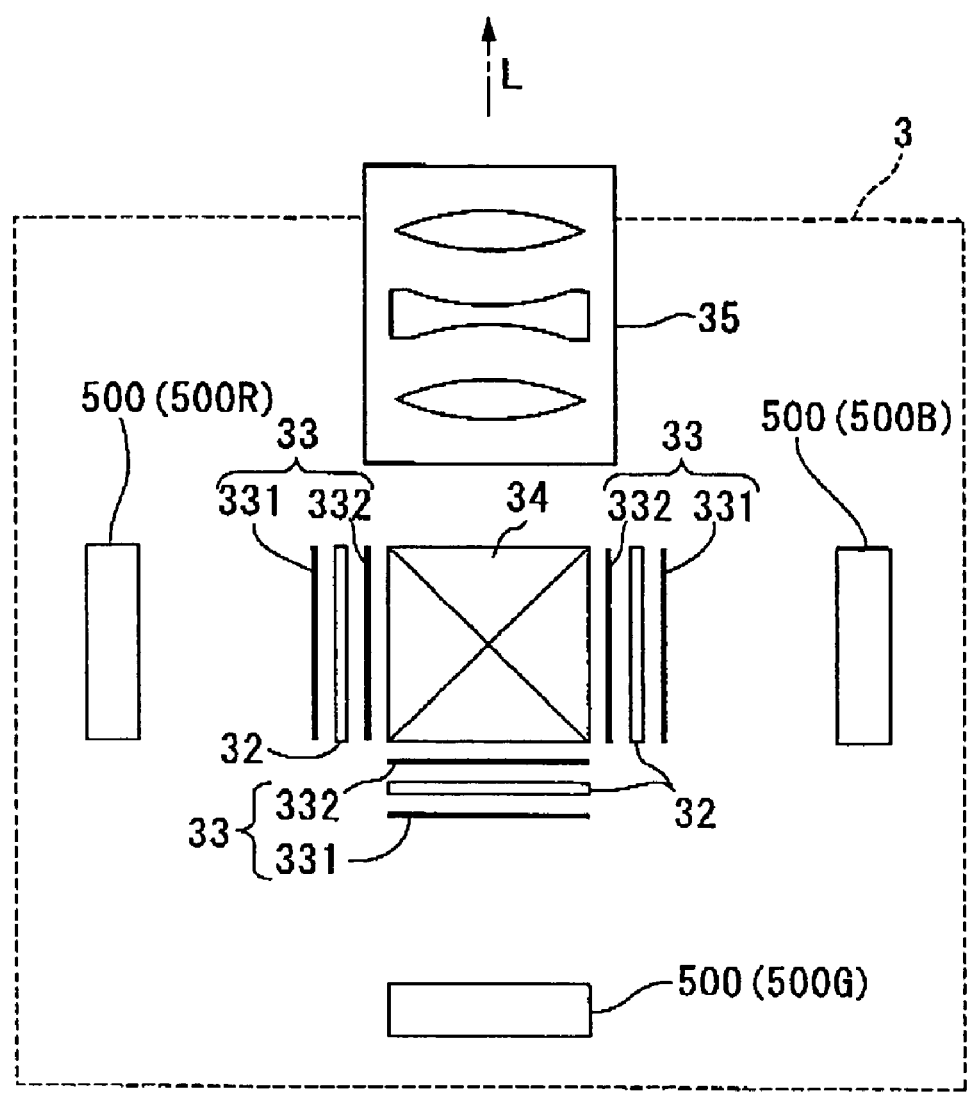
FIG. 14 is a schematic view showing an optical system of a projector.

FIG. 14 is a schematic view showing an optical system of a projector 3.

In FIG. 14, the projector 3 includes the above-described illumination device 500 which is the light source section, a liquid crystal panel 32 (light modulation element) which is a light modulation device, polarization plates 331 and 332, a cross-dichroic prism 34, and a projection lens 35.

A liquid crystal light valve 33 is constituted by the liquid crystal panel 32, the polarization plate 331 disposed at the light incidence side thereof, and the polarization plate 332 disposed at the light emission side thereof.

The light source constituted by the illumination device 500 includes a red-colored light source 500R emitting a red-colored laser light, blue-colored light source 500B emitting blue-colored laser light, and a green-colored light source 500G emitting green-colored laser light.

These light sources 500R, 500G, and 500B are disposed so as to face three side surfaces of the cross-dichroic prism 34, respectively.

In the FIG. 14, the red-colored light source 500R and the blue-colored light source 500B are disposed so as to be opposite side of each other while sandwiching the cross-dichroic prism 34. Also, the projection lens 35 and the green-colored light source 500G are disposed so as to be opposite side of each other while sandwiching the cross-dichroic prism 34. These positions are each changeable, as needed.

The liquid crystal panel 32 includes switching elements such as a poly-silicon TFT (Thin Film Transistor).

Each colored light emitted from a light source is incident to the liquid crystal panel 32 via the polarization plate 331 which is disposed at the incident side thereof.

The light which has been incident to the liquid crystal panel 32 is modulated depending on image information. The modulated light is thereby emitted from the liquid crystal panel 32.

Specified linearly polarized light in the light modulated by the liquid crystal panel 32 passes through the polarization plate 332 which is disposed at light emission side thereof, and goes toward the cross-dichroic prism 34.

The cross-dichroic prism 34 is the optical element synthesizing the colored lights which have been modulated by liquid crystal panels 32 and forming a color image.

The cross cross-dichroic prism 34 is formed by connecting four right-angle prisms.

The cross-dichroic prism 34 is formed by pasting four right-angle prisms, in a substantially regular square in a plan view.

Two-type dielectric multi layers are formed in the shape of X on a boundary face of the prisms.

The dielectric multi layers reflect each colored light emitted from the liquid crystal panels 32 which are disposed so as to be opposite side of each other via the cross-dichroic prism 34, and cause the light emitted from the liquid crystal panel 32 disposed so as to be opposite side of the projection lens 35 via the cross-dichroic prism 34 to passes itself.

In this manner, each colored light that has been modulated in the liquid crystal panel 32 is synthesized, and the color image is formed.

The projection lens 35 is constituted as an integrated the lens combined by a plurality of lenses.

The projection lens 35 projects and enlarges the color image L.

Since the projector 3 of the third embodiment includes the above-described illumination device 500 as the light source section, a high light utilization efficiency is obtained.

Since miniaturization of the illumination device itself is realized, it is possible to realize miniaturization of the projector 3.

In this embodiment, the example of projector including three light modulation elements is explained. However, the constitution described in this embodiment can be applied to a projector including one, two, three, or more than four light modulation devices.

Also, in this embodiment, the transmission-type projector is explained. The illumination device 500 and the modified example thereof can also be applied to a reflection-type projector.

Here, the "transmission-type projector" means the projector including the light modulation element through which the light passes. The "reflection-type projector" means the projector including the light modulation element in which the light reflects.

As the light modulation element, not only the liquid crystal panel 32, but also the device including, for example, a micro-mirror may be used.

Furthermore, as the projector, a front projection-type projector in which an image is projected onto a screen from the viewer side of the screen, a rear projection-type projector in which an image is projected onto a screen from the opposite side of the viewer side of the screen, are both well-known. The illumination device 500 can be applied to both the front projection-type projector and the rear projection-type projector.

The illumination device to which modified examples of the laser light source devices described in the other embodiments are applied may be used as the light source section.

Monitor

An example constitution of the monitor 40 including, for example, the above-described laser light source device 31, will be described below.

Figure 15:
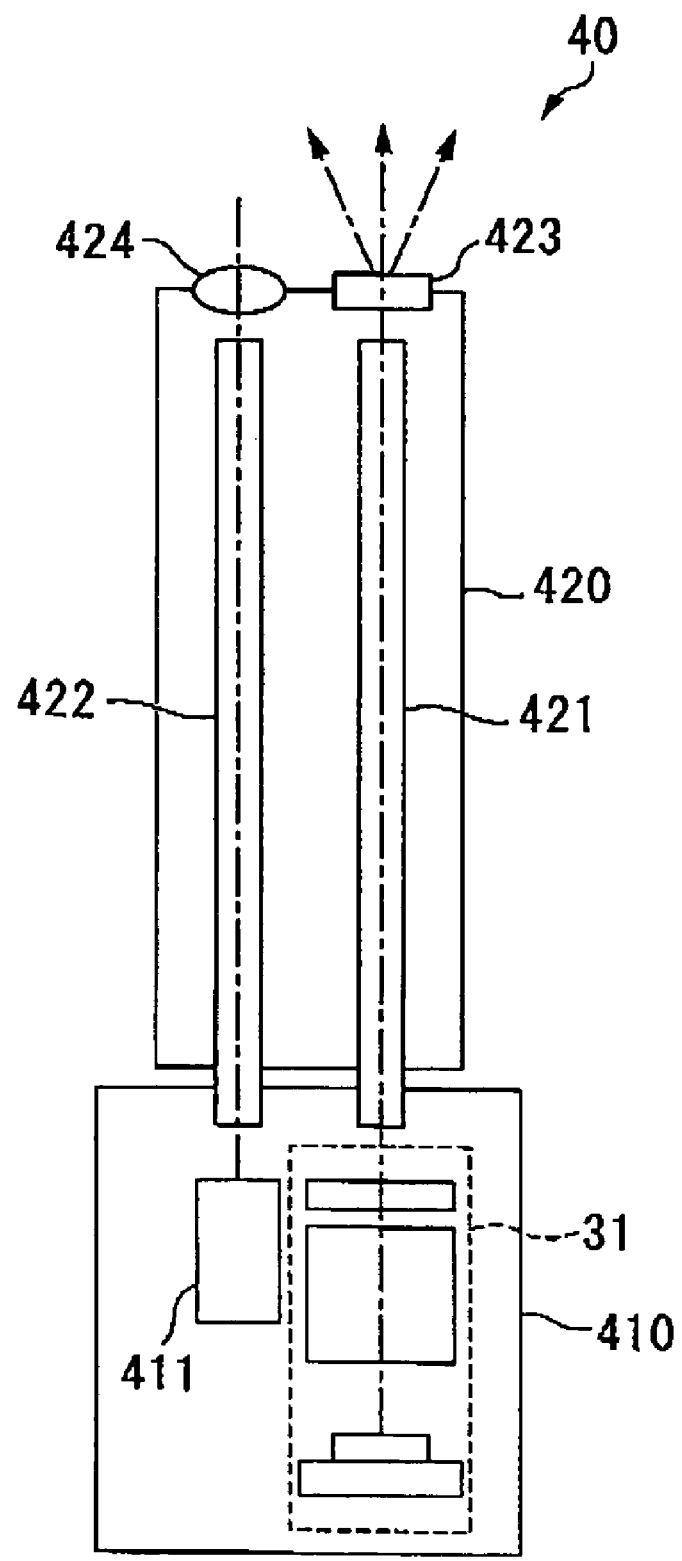
FIG. 15 is a schematic view showing a monitor.

FIG. 15 is a schematic view showing a monitor.

The monitor 400 includes a main body 410 and a light transmission section 420.

The main body 410 includes the above-described laser light source device 31.

As shown in FIG. 15, the light transmission section 420 includes two light guides 421 and 422. The light guide 421 transmits the light. The light guide 422 receives the light.

Each of the light guides 421 and 422 is constituted from a plurality of optical fibers that are sheaved. It is possible to transmit the laser light a distance by using the light guides 421 and 422.

The laser light source device 31 is disposed at the incident side of the transmitting light guide 421. A diffusing plate 423 is disposed at the emission side of the transmitting light guide 421.

The laser light emitted from the laser light source device 31 is transmitted through the light guide 421 and the diffusing plate 423 disposed at the end of the light transmission section 420, and is diffused by the diffusing plate 423. Therefore, the laser light illuminates an object.

Also, since an image-formation lens 424 is disposed at the end of the light transmission section 420, the image-formation lens 424 can receive the reflection light reflected by the object.

The reflection light that is received by the image-formation lens 424 is transmitted through the receiving light guide 422 and to a camera 411 formed in the main body 410. The camera 411 functions as an image capturing section.

As a result, due to using the laser light emitted from the laser light source device 31, the object is illuminated, the reflection light reflected by the object is obtained, and the image formed from the reflection light can be captured by the camera 411.

According to the monitor 400 constituted as described above, since the laser light source device 31 can illuminate an object with the light having a high light utilization efficiency, it is possible to improve the brightness of the image captured by the camera 411.

In the application example, the monitor 400 uses the laser light source device 31 of the first embodiment. However, instead of the laser light source device 31, the laser light source devices described in the other embodiments or the laser light source device of the modified examples may be used.

Fourth Embodiment

A fourth embodiment of the laser light source device of the invention will be described.

Identical symbols are used for the elements which are identical to those of the above-described embodiments, and the explanations thereof are omitted or simplified.

Figure 16:
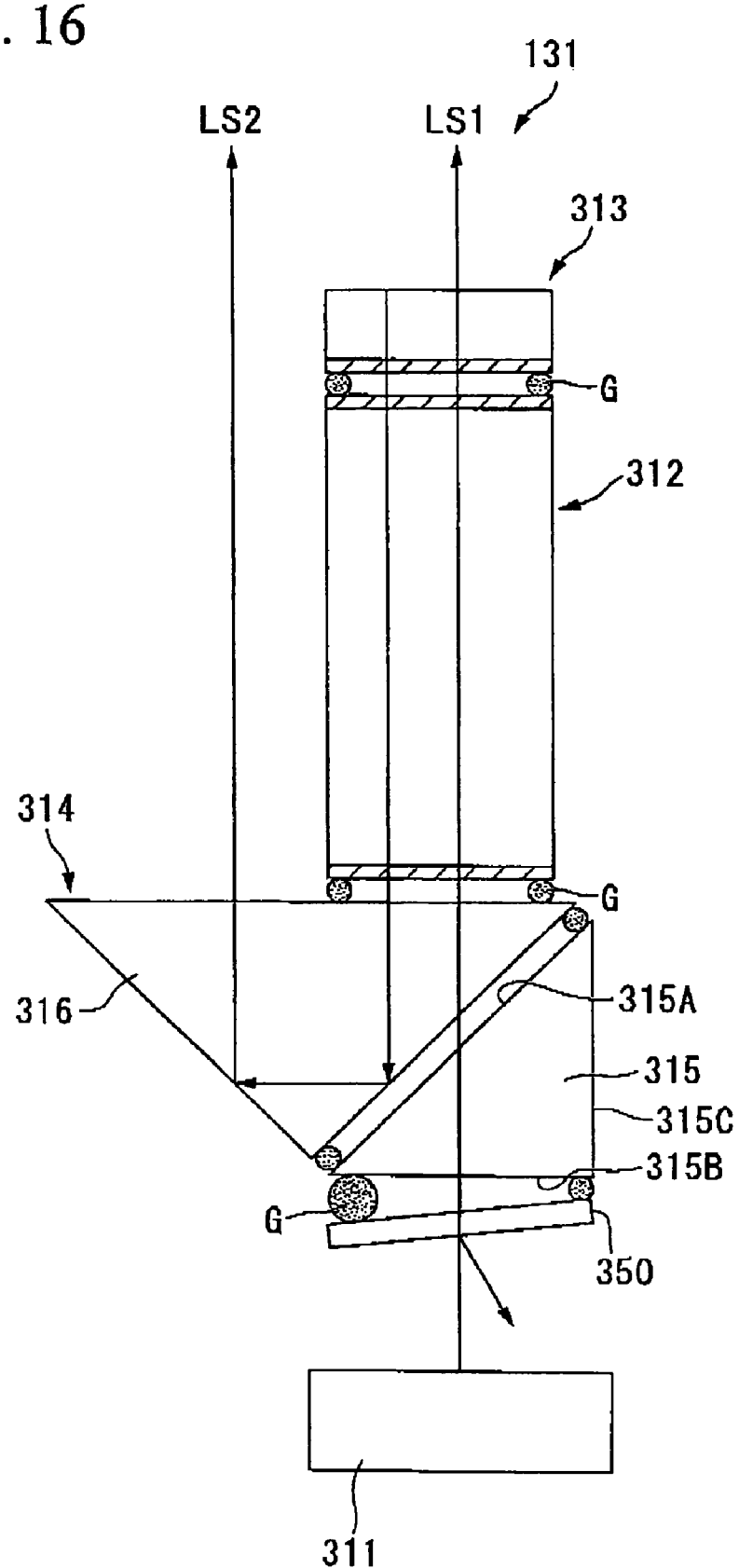
FIG. 16 is a schematic view showing the structure of a laser light source device of a fourth embodiment.

FIG. 16 is a schematic view showing the structure of a laser light source device 131 of a fourth embodiment.

As shown in FIG. 16, the laser light source device of fourth embodiment 131 includes the light source 311, the wavelength conversion element 312, the external resonator 313, and the optical-path conversion element 314.

In FIG. 16, the selective reflection film of the optical-path conversion element 314 is not shown.

In the fourth embodiment, adjacent members are connected to each other via the adhesive G including the gap members. The adhesive G is disposed between the adjacent members.

Specifically, the adhesive G is disposed between the external resonator 313 and the wavelength conversion element 312, and between the wavelength conversion element 312 and the optical-path conversion element 314.

Furthermore, the optical-path conversion element 314 of the fourth embodiment includes the prisms 316 and 315 which are connected via the above-described adhesive G.

The prism 315 has three side surfaces 315A, 315B, and 315C. The surfaces 315B and 315C sandwich the vertex angle of the isosceles triangular. The surface 315A includes the oblique side.

In the fourth embodiment, the light source 311 is disposed so as to be opposite side to the surface 315B of the prism 315.

As shown in FIG. 16, a band-pass filter 350 is disposed between the optical-path conversion element 314 and the light source 311. The band-pass filter 350 functions as the wavelength selective element.

The band-pass filter 350 is connected to the above-described prism 315 via the above-described adhesive G. The band-pass filter 350 is disposed in a state where the band-pass filter 350 is set at an angle to the side surface 315B of the prism 315.

This constitution can be realized by varying the particle diameter of the gap member included in the adhesive G or the number of the particles of the gap member.

It is thereby possible to vary and adjust the tilt angle of the band-pass filter 350, as needed.

By adjusting the tilt angle of the band-pass filter 350, it is possible to lead the light including the unnecessary wavelength component from the wavelength conversion element 312 so as not to return to the light source 311.

Furthermore, when the band-pass filter is formed of multi layers, by adjusting the tilt angle, the thickness of the multi layers can be artificially adjusted, and it is possible to select the desired wavelength.

Fifth Embodiment

A fifth embodiment of the laser light source device of the invention will be described.

Identical symbols are used for the elements which are identical to those of the above-described embodiments, and the explanations thereof are omitted or simplified.

Figure 17:
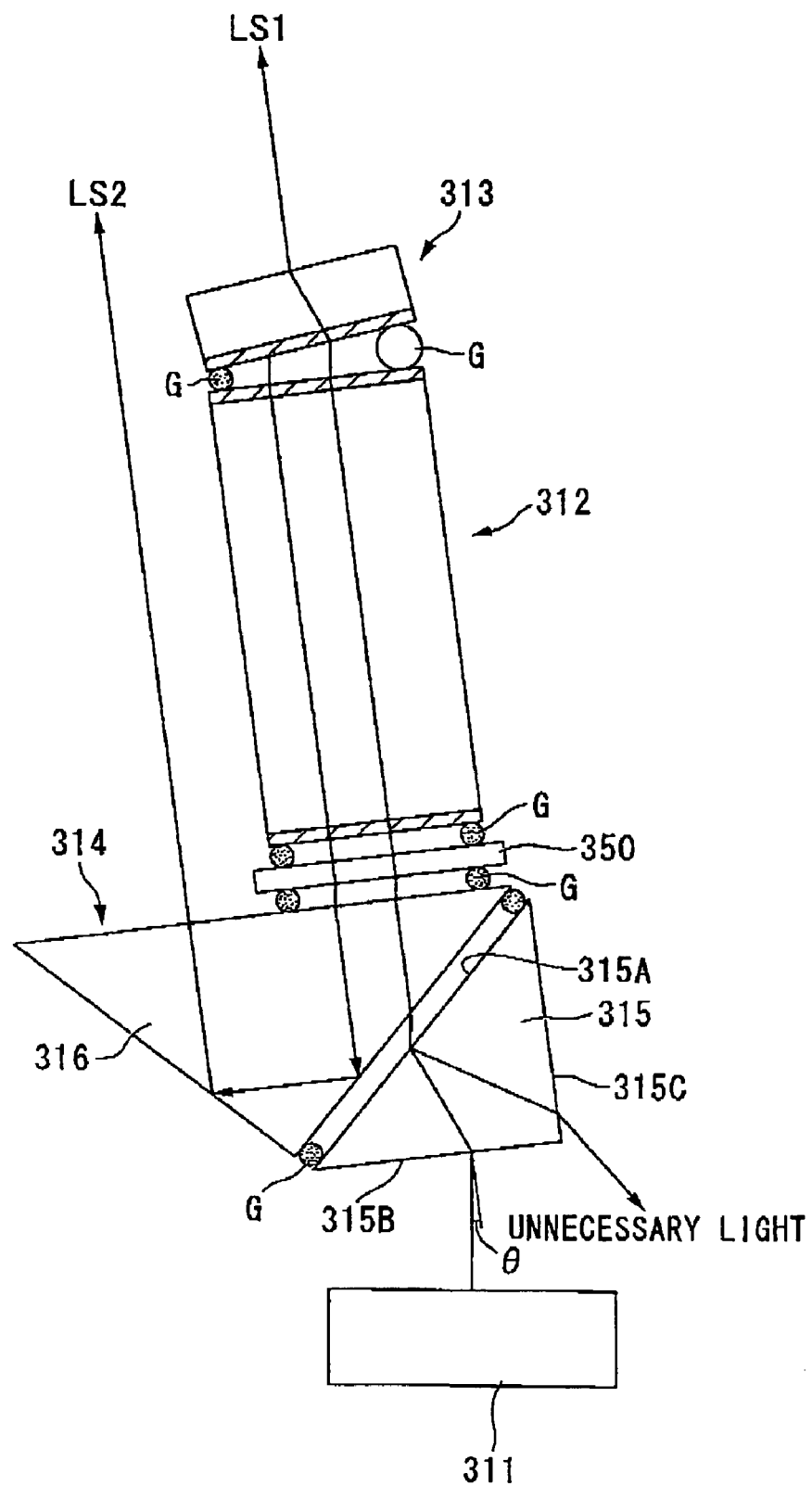
FIG. 17 is a schematic view showing the structure of a laser light source device of a fifth embodiment.

FIG. 17 is a schematic view showing the structure of a laser light source device 141 of a fifth embodiment.

As shown in FIG. 17, the laser light source device 141 of the fifth embodiment includes the wavelength conversion element 312, the band-pass filter 350, and the optical-path conversion element 314.

The wavelength conversion element 312 is disposed between the light source 311 and the external resonator 313. The wavelength conversion element 312 is integrated into the unit member including the optical-path conversion element 314, the band-pass filter 350, and the external resonator 313 via the adhesive G including the gap member.

In FIG. 17, the selective reflection film of the optical-path conversion element 314 is not shown.

The optical-path conversion element 314 of the fifth embodiment includes the prisms 316 and 315 which are connected with the adhesive G.

The prism 315 has three side surfaces 315A, 315B, and 315C. The surfaces 315B and 315C sandwich the vertex angle of the isosceles triangular. The surface 315A includes the oblique side.

Wire grids selecting polarization is formed on the surface 315B of the prism 315. An unnecessary light which has been polarization-selected does not thereby return to the light source 311.

In the fifth embodiment, the surface 315B of the prism 315 of the optical-path conversion element 314 is set at a tilt angle θ relative to the optical axis of the light emitted from the light source 311.

By setting the surface 315B at the tilt angle θ, it is possible to lead the unnecessary polarization component which is reflected by the above-described wire grids of the surface 315B to not return to the light source 311. It is possible to eliminate the unnecessary polarization component.

Therefore, it is possible to resonate the desired polarized light, and obtain a high output light.

Alternatively, the external resonator 313 is held by and disposed on the wavelength conversion element 312 via the adhesive G including the gap member. The size of the gap member is adequately adjusted so as to control the above-described tilt angle θ.

It is thereby possible to regularly reflect the light emitted from the light source 311, and to improve the laser oscillation efficiency by desirably resonating the light between the external resonator 313 and the light source 311.

Furthermore, by setting the external resonator 313 at an angle so as to cause the external resonator 313 to approach the second laser light LS2, the optical-path of the light beam LS1 which has passed through the external resonator 313 is shifted to the second laser light LS2. As a result, the light beams LS1 is thereby close to the light beam LS2. Therefore, it is possible to utilize the light beams LS1 and LS2 with a high level of efficiency when the light beams LS1 and LS2 are used as the illumination light.

Specifically, when using the light beams LS1 and LS2 as the light sources used in the projector as shown in FIG. 13, the light utilization efficiency is improved in the diffusion optical member 14, and the diffusion optical member 14 can be miniaturized. It is thereby possible to realize both miniaturization and cost reduction.

Furthermore, by varying the particle diameter of the gap member included in the above-described adhesive G, it is possible to easily adjust the tilt angle, the control of the amount of the gap, and protect the surface of each optical member.

In order to desirably select wavelength in the above-described band-pass filter 350, the above-described tilt angle θ is preferably set at approximately 2 to 4 degree. In this case, varying of the particle diameter of the gap member is available to adjust the above-described tilt angle θ.

Sixth Embodiment

A sixth embodiment of the laser light source device of the invention will be described.

Identical symbols are used for the elements which are identical to those of the above-described embodiments, and the explanations thereof are omitted or simplified.

Figure 18A:
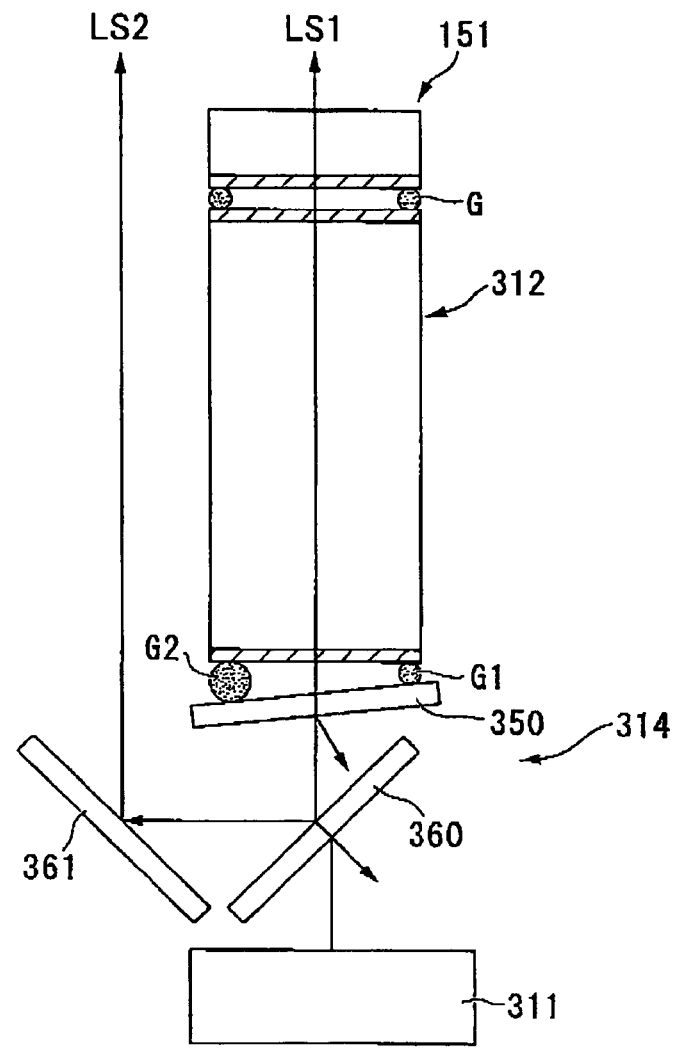
FIG. 18A is a schematic view showing the structure of a laser light source device of a sixth embodiment.

FIG. 18A is a schematic view showing the structure of a laser light source device of a sixth embodiment.

As shown in FIG. 18A, the laser light source device 151 of the sixth embodiment includes the light source 311, the wavelength conversion element 312, and the optical-path conversion element 314.

As shown in FIG. 18A, the optical-path conversion element 314 of the sixth embodiment includes the band-pass filter 350 functioning as the wavelength selective element, and a pair of mirrors 360 and 361.

The band-pass filter 350 is held by and disposed on the wavelength conversion element 312 via the particles G1 and G2 included in the adhesive G where the band-pass filter 350 is set at an angle to the wavelength conversion element 312.

The mirror 360 can select the polarization of the light emitted from the light source 311, lead an unnecessary wavelength of the light to not return to the light source 311, and eliminate the unnecessary wavelength of the light.

Therefore, by using resonation, it is possible to effectively amplify the only existing light beam.

Furthermore, as described above, by setting the band-pass filter 350 at the angle to the wavelength conversion element 312, it is possible to lead the unnecessary wavelength of the light from the wavelength conversion element 312 to not return to the light source 311, and eliminate the unnecessary wavelength of the light.

Therefore, it is possible to obtain the desired resonation and to effectively amplify the light beam.

Figure 18B:
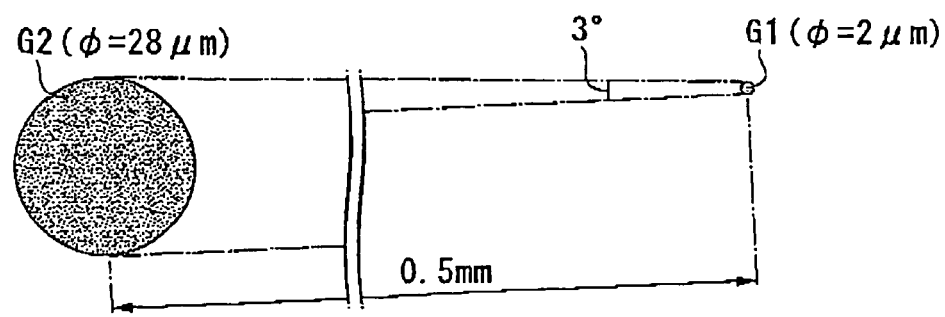
FIG. 18B is an enlarged view showing particles included in an adhesive.

FIG. 18B is an enlarged schematic view showing particles G1 and G2 included in the adhesive G disposed between the wavelength conversion element 312 and the band-pass filter 350.

As shown in FIG. 18B, the sizes of particles G1 and G2 are set to 2 μm and 28 μm, respectively.

The distance between the centers of the particles G1 and G2 is set to 0.5 mm.

By using the particles G1 and G2 having the sizes, the band-pass filter 350 can be held by and disposed on the wavelength conversion element 312 where the band-pass filter 350 is set at 3 degree to the wavelength conversion element 312.

Figure 19:
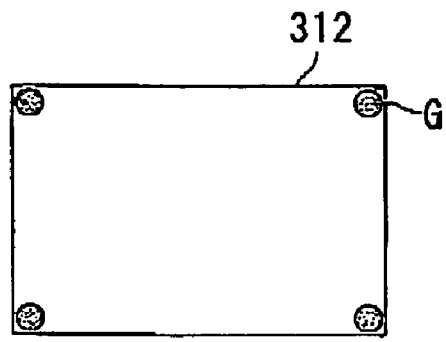
FIG. 19 is a plan view showing desired positions at which adhesives are disposed.

As shown in FIG. 19, it is preferable that the above-described adhesives G be applied at points on the periphery portion of the surface of each member, for example, the wavelength conversion element 312.

It is preferable that the adhesives G be symmetrically disposed on the members.

In this manner, by applying the adhesive G at points, the members are connected each other with adequate adhesion force, and it is possible to prevent distortion from occurring to the members.

The constitution in which the members are separated from each other by a predetermined distance without the above-described adhesive G and in which the members are set at a predetermined angle to each other will be described.

Figure 20:
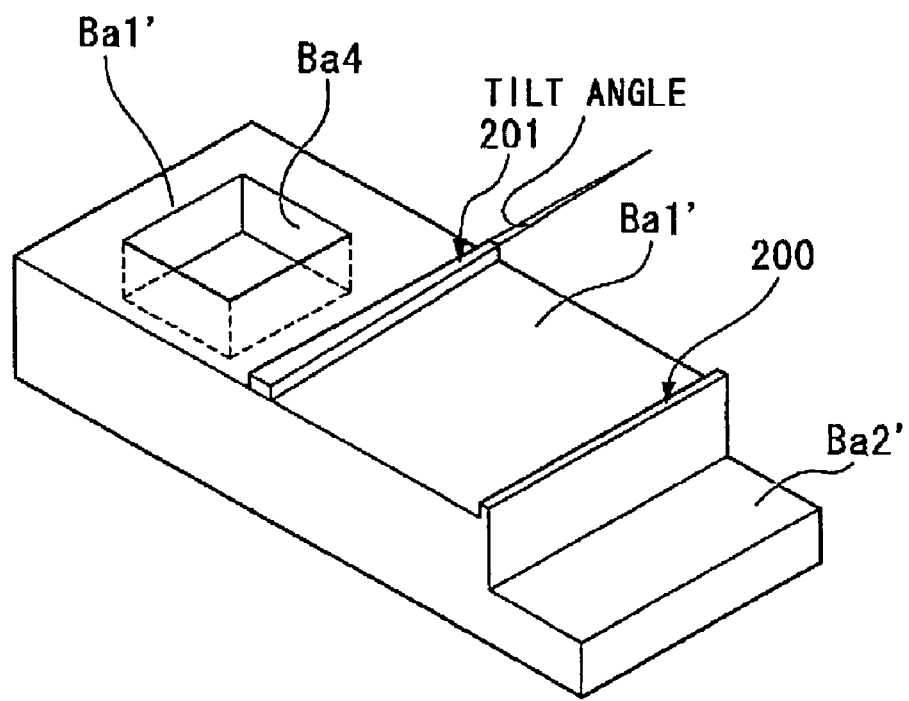
FIG. 20 is a block diagram showing a modified example of a third embodiment.

In the constitution shown in FIG. 20, the constitution of the third embodiment shown in FIGS. 9 and 10 is modified.

Specifically, the protuberance portion 201 is formed on the first surface Ba1' of the base member Ba, the protuberance portion 201 maintains the positional relationship in which the wavelength conversion element 312 is separated from the optical-path conversion element 314 by the predetermined distance, and the protuberance portion 201 also has a tilt angle.

The surface of the wavelength conversion element 312 facing to the prism 316 can thereby be set at the tilt angle to the surface of the prism 316 facing to the surface of the wavelength conversion element 312 along the lateral direction of the base member Ba. Therefore, it is possible to easily realize the constitution in which the surface of the wavelength conversion element 312 is set at the tilt angle to the surface of the prism 316.

Figure 21:
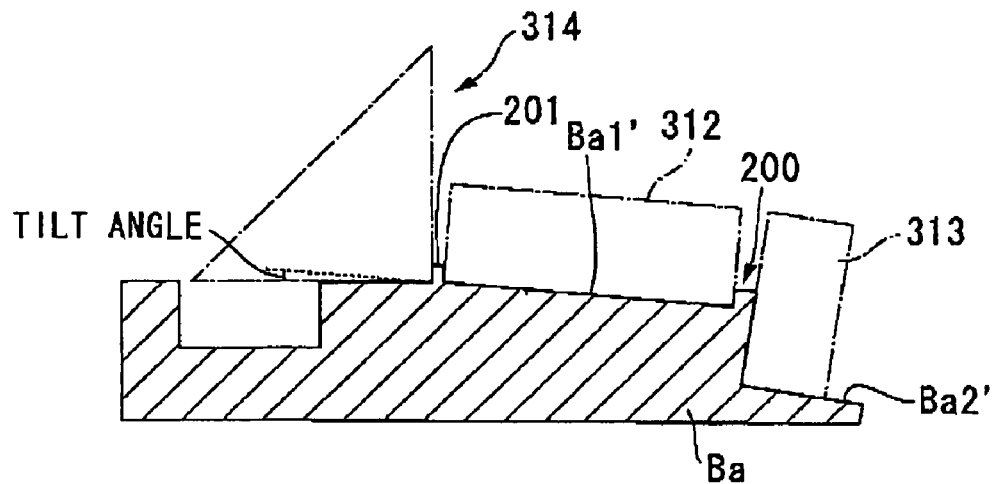
FIG. 21 is a cross-sectional view showing a modified example of the structure of a base member.

Furthermore, as another constitution, a constitution in which the first surface Ba1', which is the surface of the base member Ba between the protuberance portions 200 and 201, and the second surface Ba2' are set at an angle to the bottom surface of the base member Ba can be adopted as shown in FIG. 21.

In this constitution, the surface of the wavelength conversion element 312 facing to the optical-path conversion element 314 can be set at the tilt angle to the thickness direction of the base member Ba. Therefore, it is possible to easily realize the constitution in which the surface of the wavelength conversion element 312 is set at the tilt angle to the thickness direction of the base member Ba.

Figure 22A:
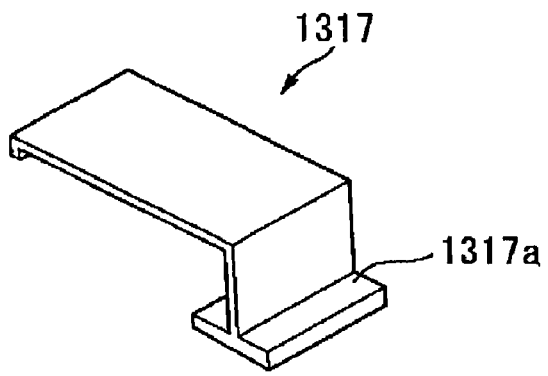
FIG. 22A is a perspective view showing a modified example of the structure of a thermal diffusion plate of the second embodiment.
Figure 22B:
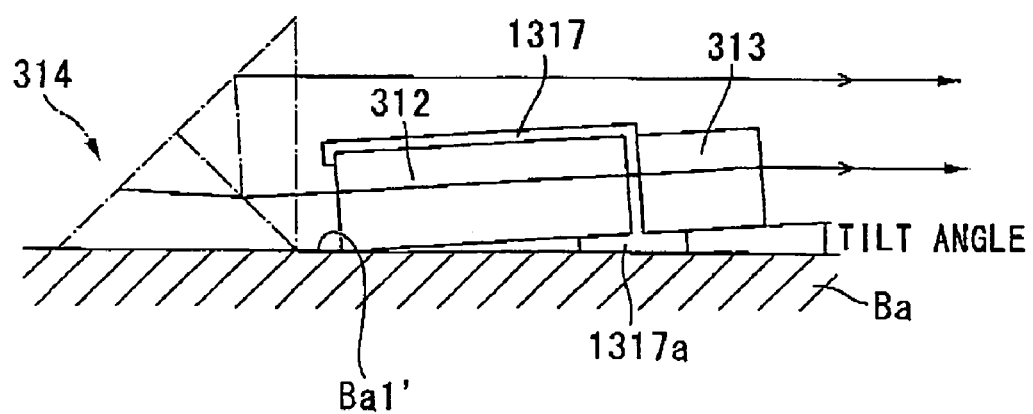
FIG. 22B is a cross-sectional view showing the modified example of the structure of the thermal diffusion plate of the second embodiment.

Furthermore, as shown in FIGS. 22A and 22B, the constitution in which the thermal diffusion plate 317 of the second embodiment shown in FIG. 7 is partly modified can be adopted. The thermal diffusion plate 1317 in FIGS. 22A and 22B radiates the heat generated from the wavelength conversion element 312 toward an exterior.

FIG. 22A is a perspective view showing the modified example of the structure of the thermal diffusion plate 1317. FIG. 22B is a cross-sectional view showing the modified example of the structure of the thermal diffusion plate 1317. FIG. 22B shows a state where the thermal diffusion plate 1317 holds the wavelength conversion element 312 and the external resonator 313 disposed on the base member Ba.

As shown in FIGS. 22A and 22B, the thermal diffusion plate 1317 includes a pedestal section 1317a coming in contact with the base member Ba.

The pedestal section 1317a causes the bottom surfaces of the wavelength conversion element 312 and the external resonator 313 to set at a tilt angle to the first surface Ba1' of the base member Ba when the pedestal section 1317a comes in contact with the base member Ba.

In this constitution, it is possible to maintain the state in which the incident surface and the emission surface of the wavelength conversion element 312 is set at the tilt angle to the incident surface and the emission surface of the optical-path conversion element 314.

Similarly to the fifth embodiment, in FIG. 22B, by setting the wavelength conversion element 312 and the external resonator 313 at the tilt angle to the first surface Ba1' so that the first laser light LS1 is close to the second laser light LS2, the optical-path of the light beam LS1 which has passed through the external resonator 313 is shifted to the light beam LS1 due to refraction. As a result, the light beam LS1 is close to the light beam LS2. Therefore, it is possible to utilize the light beams LS1 and LS2 with a high level of efficiency when the light beams LS1 and LS2 are used as the illumination light.

Specifically, when using the light beams LS1 and LS2 as the light sources in the projector as shown in FIG. 13, light utilization efficiency is improved in the diffusion optical member 14, and the diffusion optical member 14 can be miniaturized. It is thereby possible to realize both miniaturization and cost reduction.

Figure 23A:
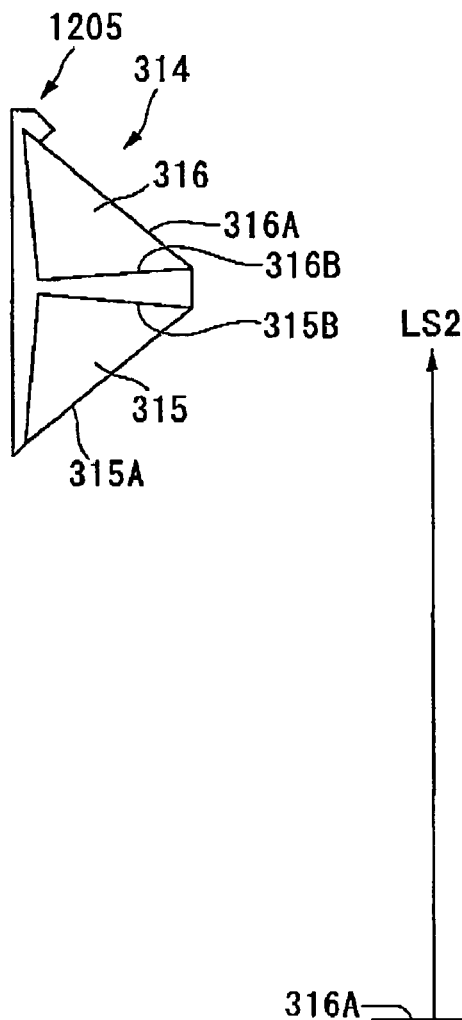
FIG. 23A is cross-sectional view showing a modified example of the structure of a unit holding member.
Figure 23B:
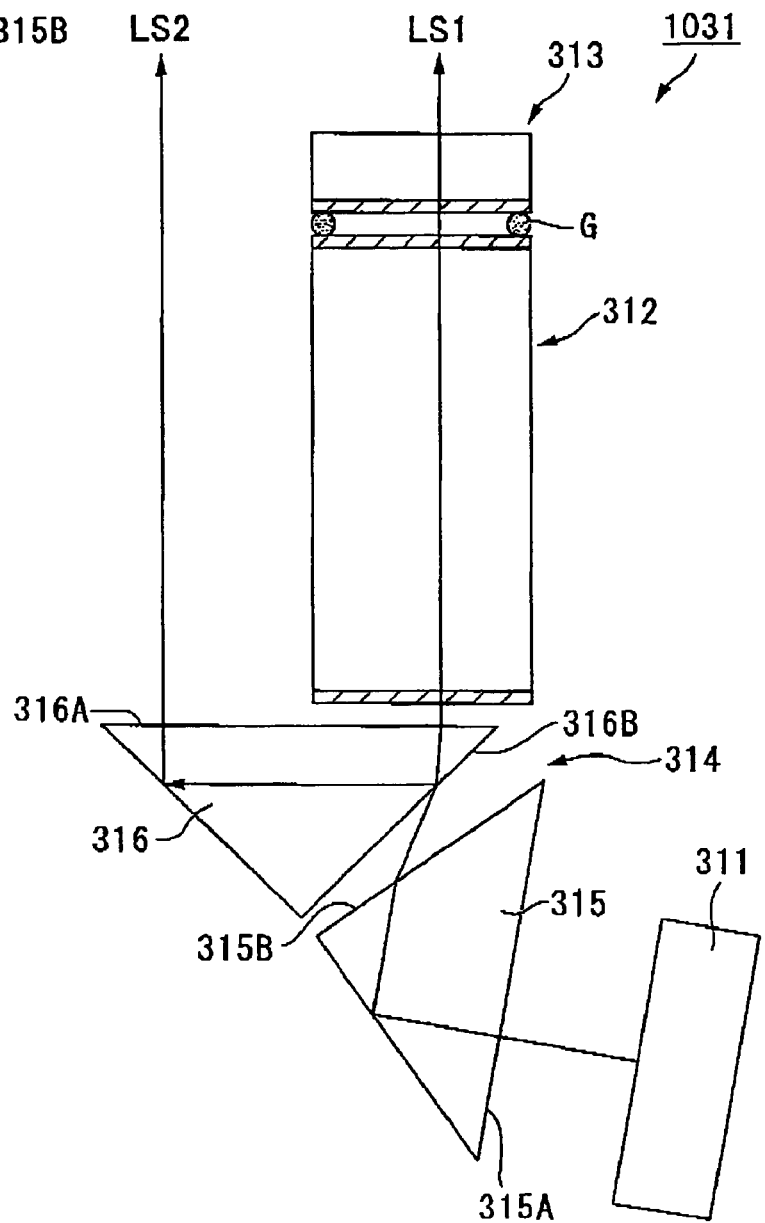
FIG. 23B is a schematic view showing the laser light source device.

Furthermore, as shown in FIGS. 23A and 23B, a constitution in which unit holding member 205 shown in FIG. 9 is partly modified can be adopted. The unit holding member 1205 in FIGS. 22A and 22B causes the optical-path conversion element 314 to integrate into a unit member.

FIG. 23A is a cross-sectional view showing a modified example of the structure of a unit holding member 1205 holding the optical-path conversion element 314. FIG. 23B is a schematic view showing the laser light source device. FIG. 23B shows a state where the unit holding member 1205 holds the optical-path conversion element 314.

As shown in FIG. 23A, the unit holding member 1205 maintains the positional relationship in which the surface 315B of the prism 315 is disposed so as to set at an angle to the surface 316B of the prism 316. The surface 315B of the prism 315 faces to the surface 316B of the prism 316.

As shown in FIG. 23B, it is thereby possible to lead the light source 311 to be disposed at a desired position relative to the optical-path conversion element 314.

The degree of freedom for designing the optical-path increases. It is possible to realize miniaturization of the device.

In FIG. 23B, the unit holding member 1205 is not shown.

Figure 24A:
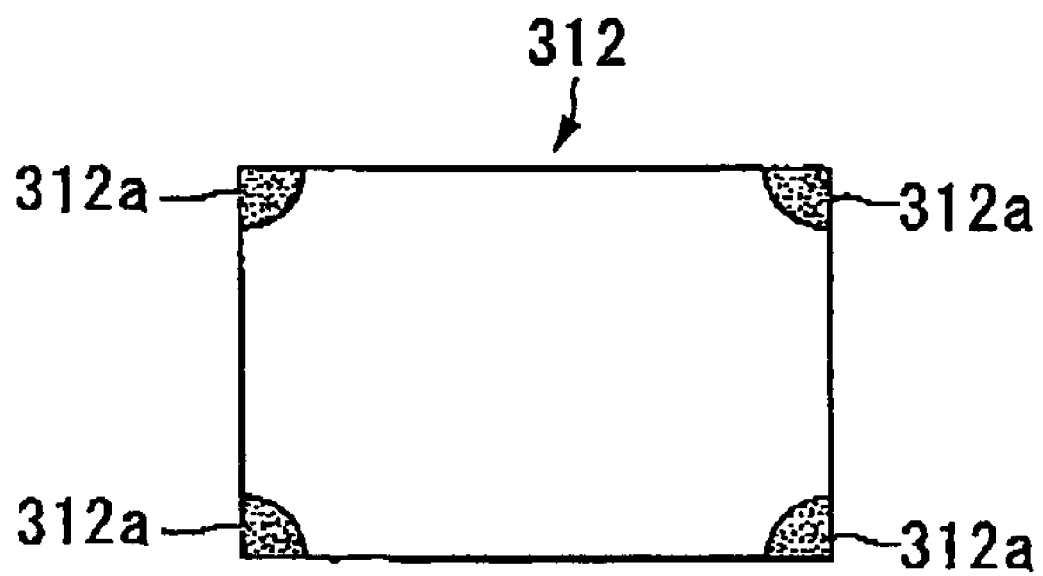
FIG. 24A is a plan view showing the structure in which a protuberance section is disposed on a wavelength conversion element.
Figure 24B:
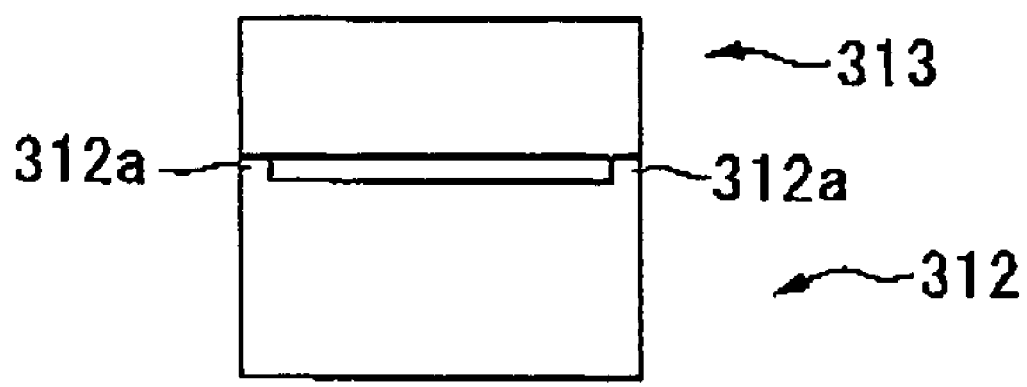
FIG. 24B is a cross-sectional view showing the structure in which the protuberance section is disposed on the wavelength conversion element.

Furthermore, instead of the adhesive including the gap member as shown in FIGS. 24A and 24B, a protuberance section 312a can be formed on the surface of the wavelength conversion element 312 facing the external resonator 313. The positional relationship in which the wavelength conversion element 312 is separated from the external resonator 313 by the predetermined distance is thereby maintained.

FIG. 24A is a plan view showing the structure in which a protuberance section 312a is formed on the wavelength conversion element 312. FIG. 24B is a cross-sectional view showing the structure in which the protuberance section is disposed on the wavelength conversion element 312.

In the protuberance section 312a, the anti-reflective film 313B (AR film) is not formed.

It is thereby possible to prevent generation of dusts due to flying particles from damaged films, caused by contact of the wavelength conversion element 312 with the external resonator 313, when assembling the optical members.

Furthermore, it is possible to realize miniaturization of the laser light source device 151 and ensure a high level of reliability and a stabilized assembled constitution.

What is claimed is:

1. A laser light source device comprising:
   a light source;
   an external resonator constituting a resonator structure with the light source;
   a wavelength conversion element disposed between the light source and the external resonator, and converting the wavelength of the light emitted from the light source;
   a base member including a recessed portion; and
   a first spacing member including a resonator holding frame holding the external resonator so as to maintain a state in which the wavelength conversion element is separated from the external resonator by a predetermined distance, the resonator holding frame including a horizontal portion that has a bottom surface, a vertical portion that has a side surface, and a protuberance portion formed in a half spherical form on an opposite side of the bottom surface, the resonator holding frame causing the external resonator to come into contact with the bottom surface and the side surface, and the protuberance portion being fitted into the recessed portion of the base member.

2. The laser light source device according to claim 1, further comprising:
   an optical-path conversion element disposed between the light source and the wavelength conversion element, and causing the light whose wavelength has been converted while returning to the light source due to reflection by the external resonator to be separated into a first optical-path and into a second optical-path different from the first optical-path, the first optical-path being formed between the light source and the external resonator, and
   a second spacing member maintaining a state where at least two optical members are adjacent to and separated from each other by a predetermined distance, the two optical members being selected from a group consisting of the optical-path conversion element, the light source, and the wavelength conversion element.

3. The laser light source device according to claim 2, wherein the optical-path conversion element includes:
   a prism member leading the light emitted from the light source toward the wavelength conversion element, and
   an optical-path separating member leading the light from the wavelength conversion element to be separated, wherein
   the second spacing member is disposed between the prism member and the optical-path separating member.

4. The laser light source device according to claim 2, wherein
   the optical-path conversion element includes a wavelength selective element selecting the wavelength of light from the wavelength conversion element.

5. The laser light source device according to claim 2, wherein
   at least one of the group consisting of the first spacing member and the second spacing member holds a first optical member separated from a second optical member by a predetermined distance where the first optical member is set at a predetermined angle to the second optical member.

6. The laser light source device according to claim 2, wherein
   the first spacing member and the second spacing member are not disposed in an optical-path.

7. The laser light source device according to claim 2, wherein
   the second spacing member includes a unit holding member integrating at least one of the optical members into a unit member.

8. The laser light source device according to claim 2, wherein
   at least one of the group consisting of the first spacing member and the second spacing member is integrated into a base member holding the light source.

9. The laser light source device according to claim 2, further comprising:
   a thermal diffusion plate radiating the heat generated from the wavelength conversion element toward an exterior, wherein
   at least one of the group consisting of the first spacing member and the second spacing member is integrated into the thermal diffusion plate.

10. The laser light source device according to claim 2, wherein
the first spacing member and the second spacing member are constituted from an adhesive including gap members maintaining the predetermined distance.

11. The laser light source device according to claim 2, wherein
the light source includes a plurality of arrayed emission sections.

12. An illumination device comprising:
the laser light source device according to claim 1; and
a diffusion optical member disposed in the emission direction of the laser light emitted from the laser light source device.

13. An image display device comprising:
a light source section constituted by the laser light source device according to claim 1; and
a light modulation element modulating the light emitted from the light source section depending on an image data.

14. A monitor comprising:
the laser light source device according to claim 1; and
an image capturing section capturing an object which is illuminated by the laser light source device.

* * * * *